United States Patent
He et al.

(10) Patent No.: US 11,916,119 B2
(45) Date of Patent: Feb. 27, 2024

(54) TRANSISTOR WITH SELF-ALIGNED GATE AND SELF-ALIGNED SOURCE/DRAIN TERMINAL(S) AND METHODS

(71) Applicant: GlobalFoundries U.S. Inc., Malta, NY (US)

(72) Inventors: Zhong-Xiang He, Essex Junction, VT (US); Jeonghyun Hwang, Ithaca, NY (US); Ramsey M. Hazbun, Colchester, VT (US); Brett T. Cucci, Colchester, VT (US); Ajay Raman, Essex Junction, VT (US); Johnatan A. Kantarovsky, South Burlington, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 217 days.

(21) Appl. No.: 17/517,738

(22) Filed: Nov. 3, 2021

(65) Prior Publication Data
US 2023/0139011 A1    May 4, 2023

(51) Int. Cl.
*H01L 29/417* (2006.01)
*H01L 29/66* (2006.01)
(Continued)

(52) U.S. Cl.
CPC ...... *H01L 29/41783* (2013.01); *H01L 29/401* (2013.01); *H01L 29/42376* (2013.01);
(Continued)

(58) Field of Classification Search
CPC ............ H01L 29/41783; H01L 29/401; H01L 29/42376; H01L 29/66462;
(Continued)

(56) References Cited

U.S. PATENT DOCUMENTS 7,470,941 B2    12/2008    Micovic et al.
7,932,539 B2    4/2011     Chen et al.
(Continued)

OTHER PUBLICATIONS

Lu et al., "High Performance Self-Aligned AlN/GaN MISHEMT with In-Situ SiNx Gate Dielectric and Regrown Source/Drain," CS Mantech Conference, 2014, pp. 201-204.
(Continued)

*Primary Examiner* — Shahed Ahmed
*Assistant Examiner* — Khatib A Rahman
(74) *Attorney, Agent, or Firm* — Francois Pagette; Hoffman Warnick LLC

(57) ABSTRACT

Disclosed are embodiments of a transistor (e.g., a III-V high electron mobility transistor (HEMT), a III-V metal-insulator-semiconductor HEMT (MISHEMT), or the like) that has multiple self-aligned terminals. The self-aligned terminals include a self-aligned gate, a self-aligned source terminal and, optionally, a self-aligned drain terminal. By forming self-aligned terminals during processing, the separation distances between the terminals (e.g., between the gate and source terminal and, optionally, between the gate and drain terminal) can be reduced in order to reduce device size and to improve performance (e.g., to reduce on resistance and increase switching speeds). Also disclosed herein are method embodiments for forming such a transistor.

20 Claims, 18 Drawing Sheets

(51) Int. Cl.
*H01L 29/423* (2006.01)
*H01L 29/40* (2006.01)
*H01L 29/778* (2006.01)

(52) U.S. Cl.
CPC .... *H01L 29/6656* (2013.01); *H01L 29/66462* (2013.01); *H01L 29/66553* (2013.01); *H01L 29/7786* (2013.01)

(58) Field of Classification Search
CPC .......... H01L 29/66553; H01L 29/6656; H01L 29/7786; H01L 29/2003; H01L 29/41725; H01L 29/207; H01L 29/42316; H01L 29/41775; H01L 29/66545
See application file for complete search history.

(56) References Cited

U.S. PATENT DOCUMENTS

| | | | | |
|---|---|---|---|---|
| 8,237,198 | B2* | 8/2012 | Wu | H01L 29/872 257/199 |
| 8,324,037 | B1 | 12/2012 | Shih et al. | |
| 8,569,769 | B2* | 10/2013 | Hwang | H01L 29/66462 438/168 |
| 9,379,229 | B2* | 6/2016 | Ohki | H03F 3/19 |
| 10,121,663 | B2* | 11/2018 | Tsuchiya | H01L 29/1041 |
| 10,679,860 | B2 | 6/2020 | Bera et al. | |
| 11,355,600 | B2* | 6/2022 | Lee | H01L 29/7786 |
| 2010/0330754 | A1* | 12/2010 | Hebert | H01L 29/66462 257/E21.403 |
| 2012/0205717 | A1* | 8/2012 | Kurahashi | H01L 29/42316 257/E21.403 |
| 2013/0295757 | A1 | 11/2013 | Xu et al. | |
| 2013/0320349 | A1* | 12/2013 | Saunier | H01L 29/7787 257/E21.409 |
| 2018/0033631 | A1 | 2/2018 | Bera et al. | |
| 2022/0130970 | A1* | 4/2022 | Kang | H01L 29/775 |
| 2023/0115846 | A1* | 4/2023 | Nguyen | H01L 21/4853 257/686 |

OTHER PUBLICATIONS

Mishra et al., "Novel High Performance Self-Aligned 0.15 Micron Long T-Gate AlInAs-GaInAs HEMTs," IEEE, 1989, pp. 101-104.

Shinohara et al., "Self-Aligned-Gate GaN-HEMTs with Heavily-Doped n+-GaN Ohmic Contacts to 2DEG," IEEE, 2012, pp. 617-620.

Shinohara et al., "Deeply-Scaled Self-Aligned-Gate GaN DH-HEMTs with Ultrahigh Cutoff Frequency," IEEE, 2011, pp. 453-456.

Singisetti et al., "Enhancement-Mode N-Polar GaN MISFETs With Self-Aligned Source/Drain Regrowth," IEEE Electron Device Letters, vol. 32, No. 2, 2011, pp. 137-139.

Waldron et al., "A Self-Aligned InGaAs HEMT Architecture for Logic Applications," IEEE Transactions on Electron Devices, vol. 57, No. 1, 2010, pp. 297-304.

Lu et al., "Fabrication and Characterization of Gate-Last Self-Aligned AlN/GaN MISHEMTs With In Situ SiNx Gate Dielectric," IEEE Transactions on Electron Devices, vol. 62, No. 6, 2015, pp. 1862-1869.

Lukens et al., "Self-Aligned Process for Selectively Etched p-GaN-Gated AlGaN/GaN-on-Si HFETs," IEEE Transactions on Electron Devices, vol. 65, No. 9, 2018, pp. 3732-3738.

Kawanago et al., "Advantage of TiN Schottky Gate Over Conventional Ni for Improved Electrical Characteristics in AlGaN/GaN HEMT", IEEE Proceedings of the European Solid-State Device Research Conference (ESSDERC), 2013, pp. 1-4.

News Article, "Imec Shows Scalable III-V and III-N Devices on Silicon", 2020, https://compoundsemiconductor.net/article/109922/Imec_shows_Scalable_III-V_and_III-N_Devices_on_Silicon, Accessed on Oct. 13, 2020, pp. 1-2.

Xia et al., "Effects of the Cap Layer on the Properties of AlN Barrier HEMT Grown on 6-Inch Si (111) Substrate", Materials Research Express 7 065902, 2020, pp. 1-7.

* cited by examiner

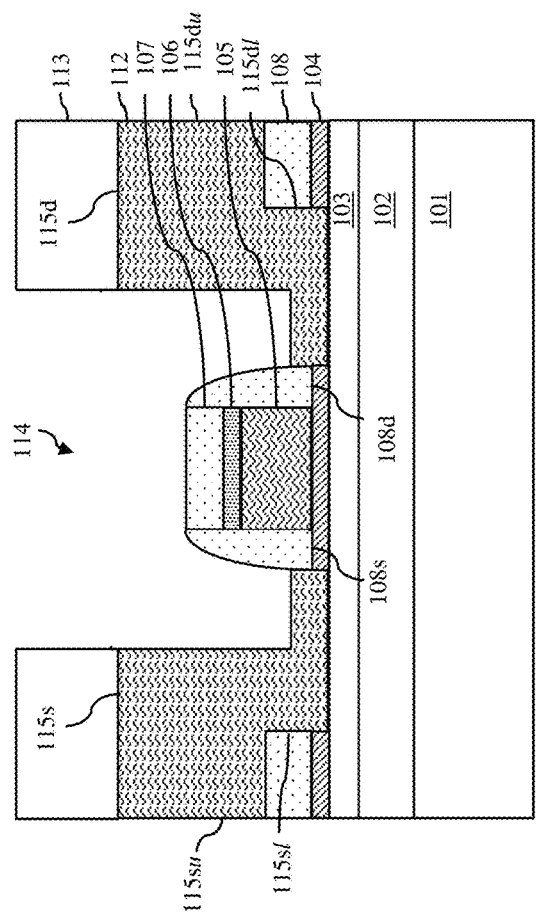
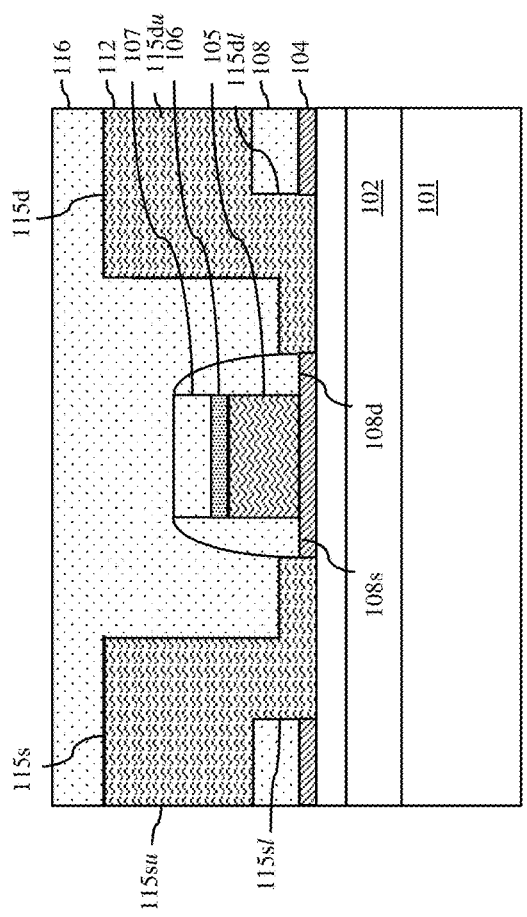
FIG. 4(7)
FIG. 4(8)

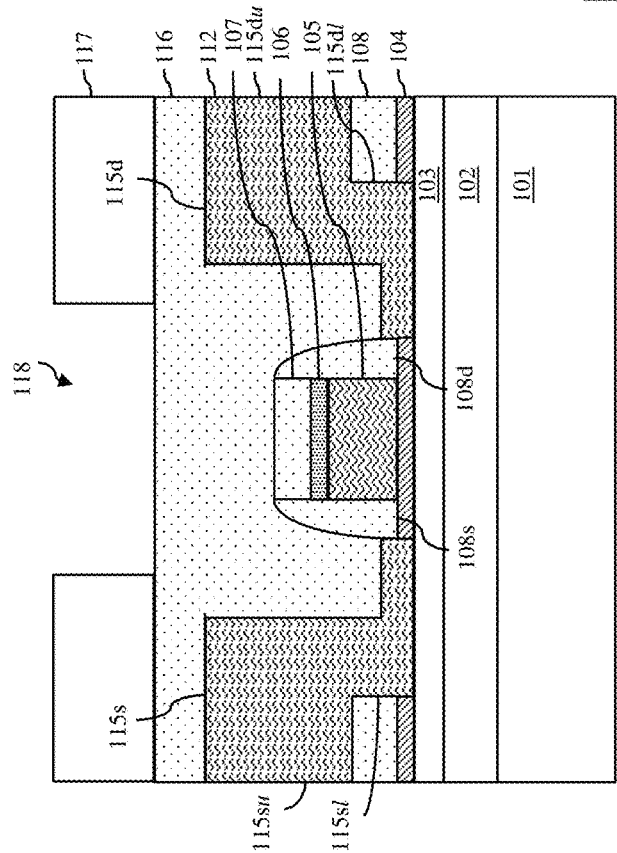
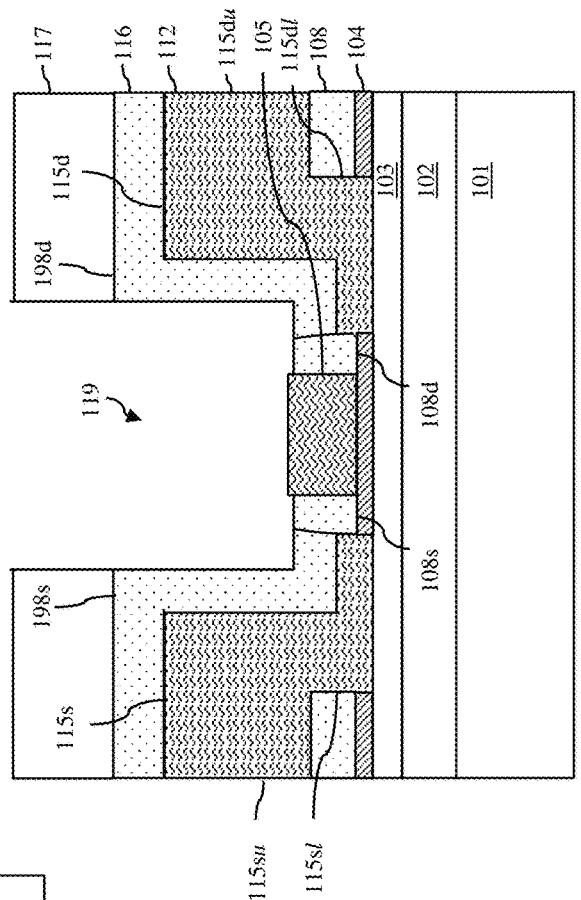
FIG. 4(9)
FIG. 4(10)

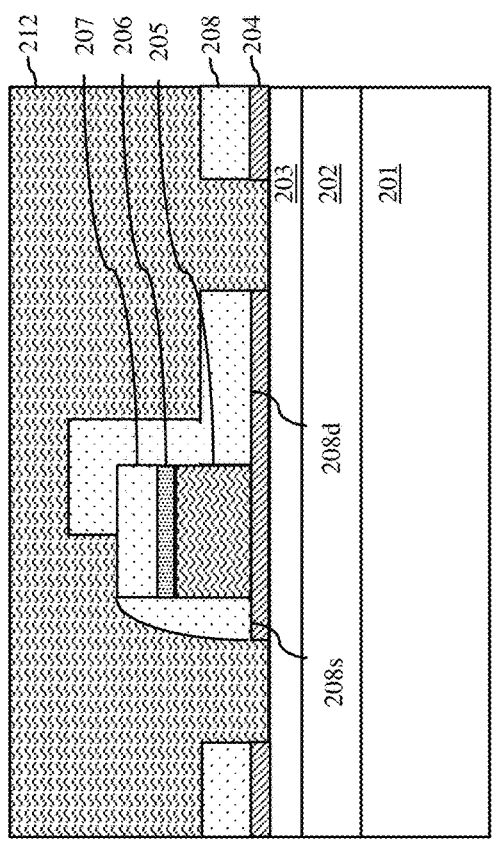
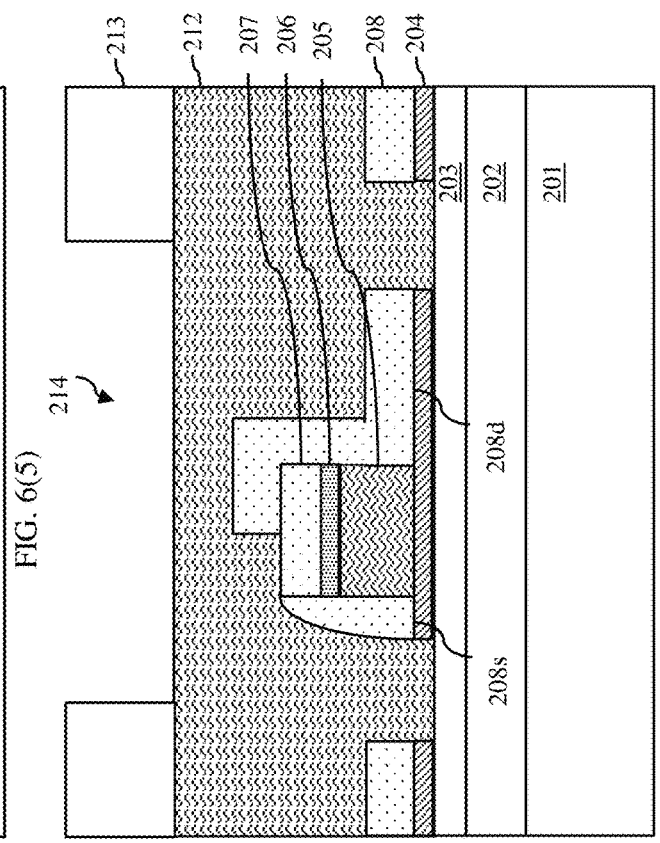
FIG. 6(5)
FIG. 6(6)

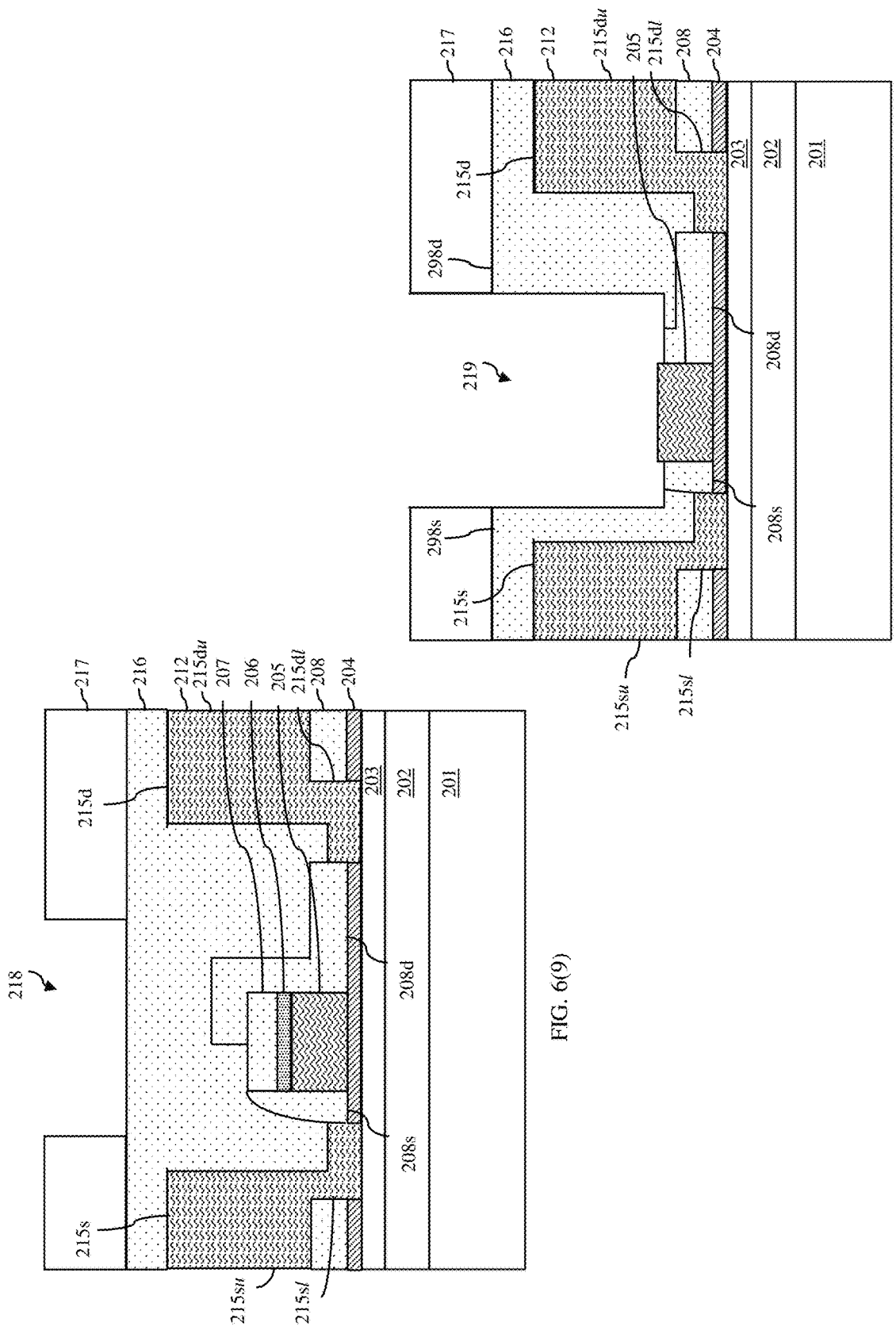

TRANSISTOR WITH SELF-ALIGNED GATE AND SELF-ALIGNED SOURCE/DRAIN TERMINAL(S) AND METHODS

BACKGROUND

Field of the Invention

The present invention relates to transistors and, more particularly, to embodiments of a transistor (e.g., a III-V high electron mobility transistor (HEMT), a III-V metal-insulator-semiconductor HEMT (MISHEMT), or the like), which has a self-aligned gate and at least a self-aligned source terminal, and to embodiments of a method for forming the transistor.

Description of Related Art

III-V semiconductor devices, such as high electron mobility transistors (HEMTs) and metal-insulator-semiconductor HEMTs (MISHEMTs), have emerged as a leading technology for radio frequency (RF) and millimeter wave (mm-Wave) (e.g., 3-300 GHz) wireless applications. However, as device sizes continue to be scaled, HEMTs and MISHEMTs as well as other types of transistors can suffer from fails due to misalignment of the device terminals (e.g., misalignment of the gate and the source/drain terminals) during lithographic patterning. Furthermore, reducing separation distances between the device terminals (e.g., between the gate and each of the source/drain terminals) in order to improve performance (e.g., to reduce on resistance and increase switching speed) is also limited due to the potential for misalignment as well as image size variation during lithographic patterning.

SUMMARY

Disclosed herein are embodiments of a transistor structure (e.g., a III-V high electron mobility transistor (HEMT), a III-V metal-insulator-semiconductor HEMT (MISHEMT), or the like). The transistor can include a gate with a first gate section, which is on a barrier layer above a channel layer, and with a second section, which is on and wider than the first gate section. The transistor can also include a source-side gate sidewall spacer positioned laterally adjacent to the first gate section with the second gate section extending over the top of the source-side gate sidewall spacer. The transistor can further include a source terminal with a first source region and a second source region. The first source region can extend through the barrier layer and can have a proximal portion, which is adjacent to the source-side gate sidewall spacer, and a distal portion. The second source region can be on the distal portion of the first source region and a source-side dielectric liner can be on the proximal portion of the first source region so as to be positioned laterally between the second gate section and the second source region.

Also disclosed herein are method for forming a transistor structure (e.g., a III-V high electron mobility transistor (HEMT), a III-V metal-insulator-semiconductor HEMT (MISHEMT), or the like).

For example, some method embodiments can include forming a barrier layer can on a channel layer and then forming a transistor structure using the barrier and channel layers. Specifically, the transistor can be formed so as to include a gate with a first gate section, which is on the barrier layer, and with a second section, which is on and wider than the first gate section. The transistor can further be formed so as to include a source-side gate sidewall spacer positioned laterally adjacent to the first gate section with the second gate section extending over the top of the source-side gate sidewall spacer. The transistor can further be formed so as to include a source terminal with a first source region and a second source region. The first source region can extend through the barrier layer and can have a proximal portion, which is adjacent to the source-side gate sidewall spacer, and a distal portion. The second source region can be on the distal portion of the first source region. The transistor can further be formed so as to include a source-side dielectric liner on the proximal portion of the first source region so as to be positioned laterally between the second gate section and the second source region.

Other method embodiments can similarly include forming a barrier layer on a channel layer and forming a transistor structure using the barrier and channel layers. In these embodiments, the transistor can be formed so as to include a gate with a first gate section, which is on the barrier layer, and a second gate section, which is on and wider than the first gate section. The transistor can further be formed so as to include gate sidewall spacers, which are on the barrier layer and positioned laterally adjacent to the first gate section and which are asymmetric. Specifically, the gate sidewall spacers can include a source-side gate sidewall spacer and a drain-side gate sidewall spacer that is L-shaped and wider than the source-side gate sidewall spacer. The second gate section can extend laterally at least partially over the gate sidewall spacers. The transistor can further be formed so as to include a source terminal with a first source region and a second source region. The first source region can extend through the barrier layer, can have a proximal portion adjacent to the source-side gate sidewall spacer, and can have a distal portion. The second source region can be on the distal portion of the first source region.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

As mentioned above, III-V semiconductor devices, such as high electron mobility transistors (HEMTs) and metalinsulator-semiconductor HEMTs (MISHEMTs), have emerged as a leading technology for radio frequency (RF) and millimeter wave (mmWave) (e.g., 3-300 GHz) wireless applications. However, as device sizes continue to be scaled, HEMTs and MISHEMTs as well as other types of transistors can suffer from fails due to misalignment of the device terminals (e.g., misalignment of the gate and the source/drain terminals) during lithographic patterning. Furthermore, reducing separation distances between the device terminals (e.g., between the gate and each of the source/drain terminals) in order to improve performance (e.g., to reduce on resistance and increase switching speed) is also limited due to the potential for misalignment as well as image size variation during lithographic patterning.

In view of the foregoing, disclosed herein are embodiments of a transistor (e.g., a III-V high electron mobility transistor (HEMT), a III-V metal-insulator-semiconductor HEMT (MISHEMT), or the like) that has multiple self-aligned terminals. The self-aligned terminals can include a self-aligned gate, a self-aligned source terminal and, optionally, a self-aligned drain terminal. By forming self-aligned terminals during processing, the separation distances between the terminals (e.g., between the gate and source terminal and, optionally, between the gate and drain terminal) can be reduced in order to reduce device size and improve performance (e.g., to reduce on resistance and increase switching speeds). Also disclosed herein are method embodiments for forming such a transistor.

Figure 1A:
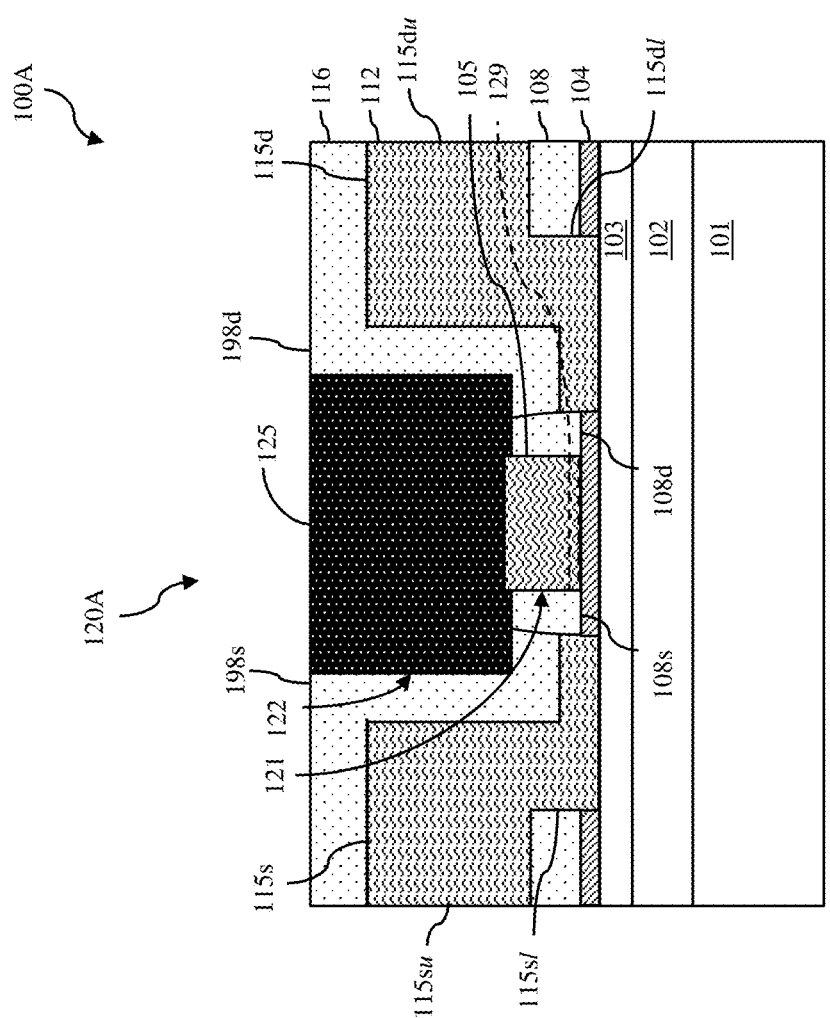
FIG. 1A is a cross-section drawing illustrating an embodiment of a symmetric transistor (e.g., a symmetric III-V high electron mobility transistor (HEMT) or a symmetric III-V metal-insulator-semiconductor HEMT (MISHEMT))
Figure 1B:
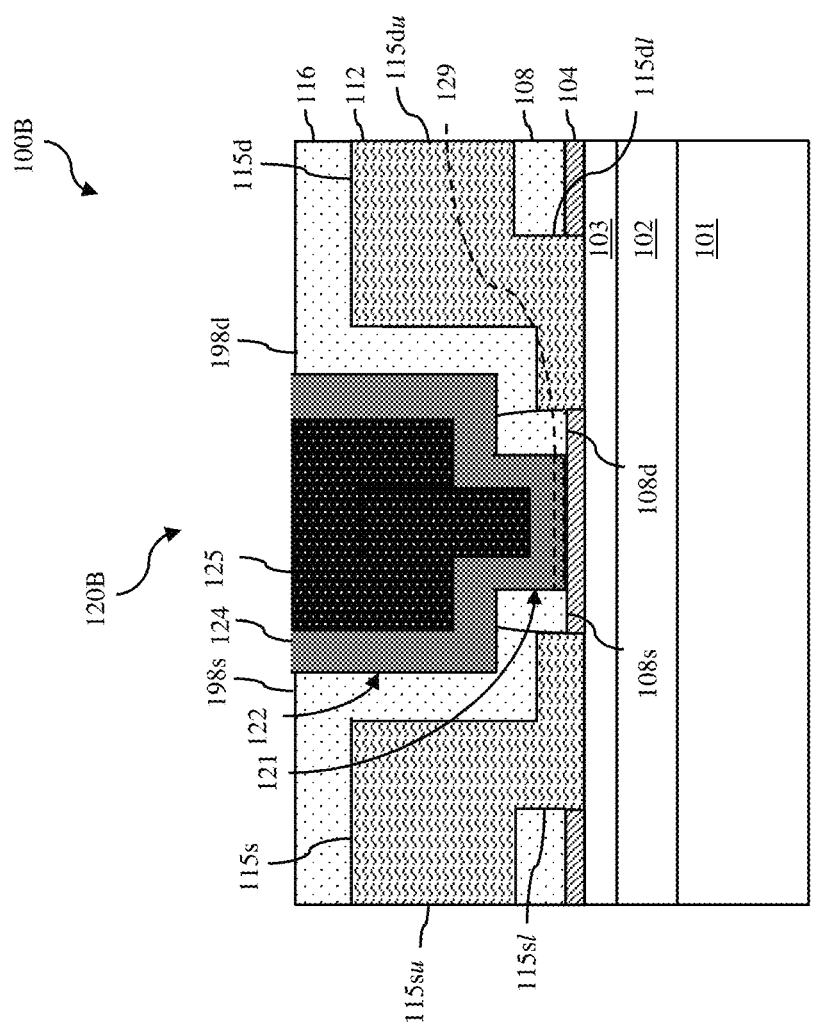
FIG. 1B is a cross-section drawing illustrating another embodiment of a symmetric transistor (e.g., a symmetric HEMT or a symmetric MISHEMT)
Figure 2A:
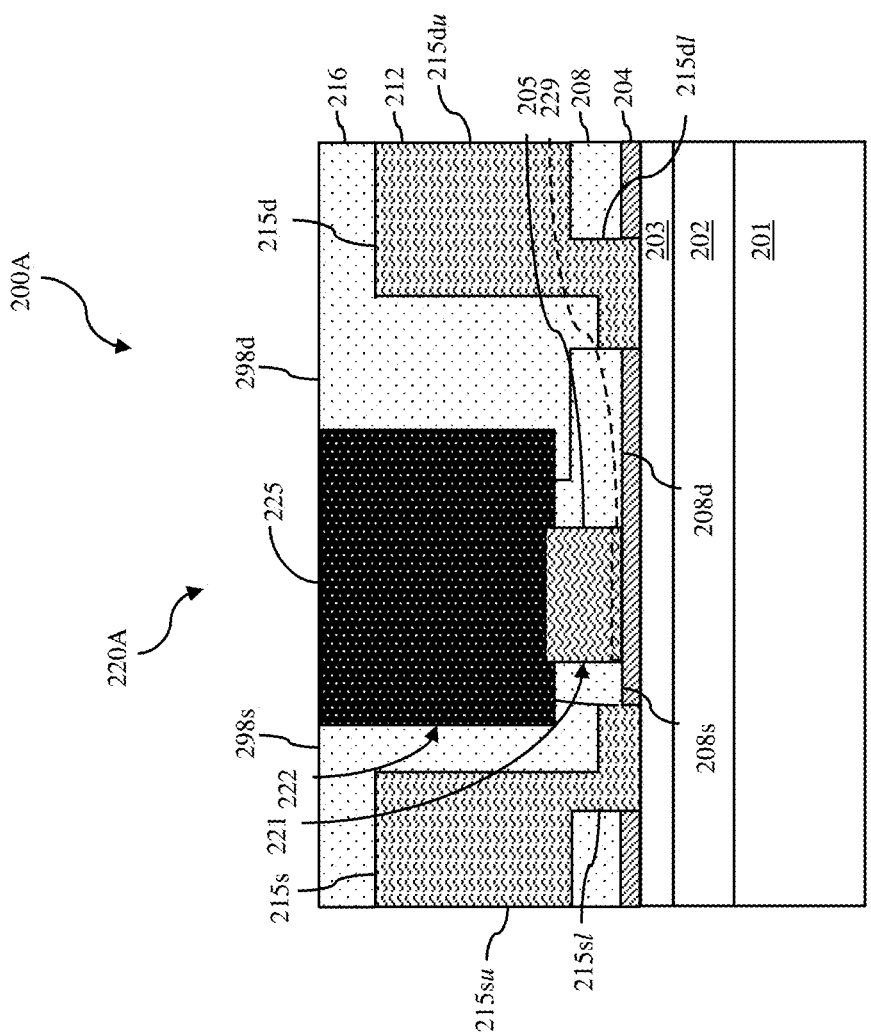
FIG. 2A is a cross-section drawing illustrating an embodiment of an asymmetric transistor (e.g., an asymmetric HEMT or an asymmetric MISHEMT)
Figure 2B:
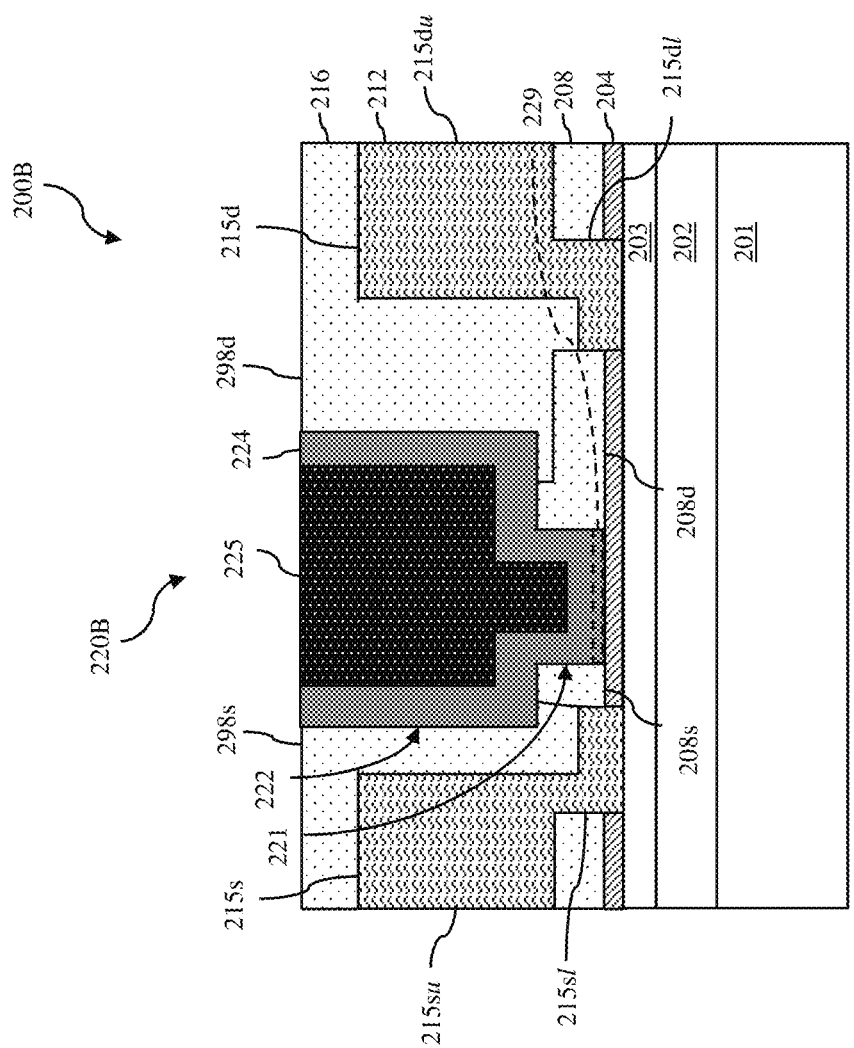
FIG. 2B is a cross-section drawing illustrating another embodiment of an asymmetric transistor (e.g., an asymmetric HEMT or an asymmetric MISHEMT)

More particularly, disclosed herein are embodiments of a transistor (e.g., a III-V high electron mobility transistor (HEMT), a III-V metal-insulator-semiconductor HEMT (MISHEMT), or the like) (e.g., see transistor 100A of FIG. 1A, 100B of FIG. 1B, 200A of FIGS. 2A and 200B of FIG. 2B). In each of the embodiments, the transistor can have multiple self-aligned terminals. In some embodiments, the transistor can be symmetrical (or close thereto) with a self-aligned gate and self-aligned source and drain terminals, where the source and drain terminals are separated from the gate by essentially the same separation distances (e.g., see transistor 100A of FIG. 1A and 100B of FIG. 1B). Such a transistor 100A, 100B is optimal for use as, for example, a switch. In other embodiments, the transistor can be asymmetrical with a self-aligned gate and a self-aligned source terminal, but with a non-self-aligned drain terminal that is separated from the gate by a greater separation distance than the source terminal for increased breakdown voltage (e.g., see transistor 200A of FIG. 2A and 200B of FIG. 2B). Such a transistor 200A, 200B is optimal for use in, for example, a power amplifier.

In any case, the transistor 100A, 100B, 200A, 200B can be above multiple epitaxially grown semiconductor layers on a semiconductor substrate 101, 201.

The semiconductor substrate 101, 201 can be, for example, a silicon or silicon-based substrate (e.g., a silicon carbide (SiC) substrate), a sapphire substrate, a III-V semiconductor substrate (e.g., a gallium nitride (GaN) substrate or some other suitable III-V semiconductor substrate) or any other suitable substrate for a III-V semiconductor device.

The epitaxially grown semiconductor layers on the substrate 101, 201 can include, for example: an optional buffer layer 102, 202 on the top surface of the semiconductor substrate 101, 201; a channel layer 103, 203 on the buffer layer 102, 202; and a barrier layer 104, 204 on the channel layer 103, 203. These epitaxial grown semiconductor layers can be, for example, III-V semiconductor layers. Those skilled in the art will recognize that a III-V semiconductor refers to a compound obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP).

The optional buffer layer 102, 202 can be employed to facilitate growth of the channel layer 103, 203 and to provide for lattice constants of the substrate 101, 201 below and the channel layer 103 above. The buffer layer 102, 202 can be doped or undoped. Optionally, the buffer layer 102, 202 can be carbon-doped. The barrier layer 104, 204 can have a band gap that is wider than the bandgap of the channel layer 103, 203 for the device channel. Those skilled in the art will recognize that the barrier and channel materials can be selected so that a heterojunction is formed at the interface between the two layers, thereby resulting in the formation of a two-dimensional electron gas (2DEG) in the channel layer 103, 203. This 2DEG in the channel layer 103, 203 can provide the conductive pathway for the drifting of charges between the source and the drain.

In some embodiments, the buffer layer 102, 202 could be a carbon-doped gallium nitride (C—GaN) buffer layer or a buffer layer of any other material suitable for use as a buffer layer of a HEMT or MISHEMT. The channel layer 103, 203 could be a gallium nitride (GaN) layer or a III-V semiconductor channel layer made of any other III-V semiconductor compound suitable for use as a channel layer in a HEMT or MISHEMT. The barrier layer 104, 204 could be an aluminum gallium nitride (AlGaN) barrier layer or a barrier layer of any other material suitable for use as a barrier layer in a HEMT or MISHEMT.

For purposes of illustration, the figures and the description above depict the epitaxially grown layers (e.g., the buffer layer 102, 202; the channel layer 103, 203; and the barrier layer 104, 204) as being single layered structures (i.e., comprising one layer of buffer material, one layer of channel material and one layer of barrier material). However, it should be understood that, alternatively, any one or more of the epitaxially grown layers could be multi-layered structures (e.g., comprising multiple sub-layers of different buffer materials, multiple sub-layers of different III-V semiconductor channel materials and/or multiple sub-layers of different barrier materials).

In each of the embodiments, the transistor 100A, 100B, 200A, 200B can include a gate 120A, 120B, 220A, 220B. The gate 120A, 120B, 220A, 220B can be self-aligned (i.e., formed at least in part using a self-alignment processing technique, as discussed in greater detail below with regard to the methods embodiments). The gate 120A, 120B, 220A, 220B can include a first gate section 121, 221 (also referred to herein as a lower gate section) on the barrier layer; and a second gate section 122, 222 (also referred to herein as an upper gate section) on the first gate section 121, 221. The second gate section 122, 222 can specifically be above, immediately adjacent to, and wider than the first gate section 121, 221 (as measured in a direction essentially parallel to the bottom surface of the substrate) such that the gate 120A, 120B, 220A, 220B is essentially T-shaped. The gate 120A, 120B, 220A, 220B can include at least two different gate metal materials, as discussed in greater detail below with regard to the specific structure embodiments.

In any case, in each of the embodiments, the transistor 100A, 100B, 200A, 200B can include gate sidewall spacers, which are positioned laterally adjacent to opposing sidewalls of the first gate section 121, 221. The gate sidewall spacers can include a source-side gate sidewall spacer 108s, 208s and a drain-side gate sidewall spacer 108d, 208d. Since the second gate section 122, 222 of the gate 120A, 120B, 220A, 220B is wider than the first gate section 121, 221, the second gate section 122, 222 extends laterally at least partially over the gate sidewall spacers 108s-108d, 208s-208d. In some embodiments, the gate sidewall spacers can be essentially symmetrical with essentially the same vertically oriented shape and essentially the same width (e.g., see the gate sidewall spacers 108s-108d in the transistor 100A, 100B). In other embodiments, the gate sidewall spacers can be asymmetrical with the source-side gate sidewall spacer 208s being essentially vertically oriented and with the drain-side gate sidewall spacer 208d being wider than the source-side gate sidewall spacer 208s (as measured in a direction essentially parallel to the bottom surface of the substrate) and essentially L-shaped, including a vertical portion on the drain-side sidewall of the first gate section 221 and with a horizontal portion extending laterally away from the first gate section 221 along the barrier layer 204 (e.g., see the gate sidewall spacers 208s-208d in the transistor 200A, 200B). The gate sidewall spacers 108s-108d, 208s-208d can be made, for example, of silicon dioxide or some other isolation material suitable for use as a gate sidewall spacer.

Additionally, in each of the embodiments, the transistor 100A, 100B, 200A, 200B can further include dielectric liners positioned laterally adjacent to opposing sidewalls of the second gate section 122, 222. The dielectric liners can include a source-side dielectric liner 198s, 298s and a drain-side dielectric liner 198d, 298d. In some embodiments, the dielectric liners can be, for example, essentially symmetrical with similar widths (e.g., see the dielectric liners 198s-198d in the transistor 100A, 100B). In other embodiments, the dielectric liners can be asymmetrical with, for example, different widths and, particularly, with the drain-side dielectric liner being wider than the source-side dielectric liner (as measured in a direction essentially parallel to the bottom surface of the substrate) (e.g., see the dielectric liners 298s-298d in the transistor 200A, 200B).

It should be noted that, as illustrated in the transistors 100A of FIG.1A and 100B of FIG. 1B, if the second gate section 122 extends laterally beyond the gate sidewall spacers 108s and 108d, then the dielectric liners 198s and 198d will also wrap around the bottom corners of the second gate section 122 to the gate sidewall spacers 108s and 108d. Similarly, as illustrated in the transistors 200A of FIG.2A and 200B of FIG. 2B, if the second gate section 222 extends laterally beyond the source-side gate sidewall spacer 208s and the vertical portion of the drain-side gate sidewall spacer 208d, then the dielectric liners 298s and 298d will also wrap around the bottom corners of the second gate section 222 to the source-side gate sidewall spacer 208s and to the vertical portion of the drain-side gate sidewall 208d.

Thus, in each of the embodiments, the first gate section 121, 221 of the gate 120A, 120B, 220A, 220B sits in the space between the gate sidewall spacers 108s-108d, 208s-208d and the second gate section 122, 222 sits in the space between the dielectric liners 198s-198d, 298s-298d above the first gate section 121, 221 and gate sidewall spacers. As mentioned above, the gate 120A, 120B, 220A, 220B can include at least two different gate metal materials and, particularly, a first gate metal layer and a second gate metal layer.

For example, in the gate 120A of the transistor 100A and in the gate 220A of the transistor 200A, the first gate section 121, 221 can include a first gate metal layer 105, 205, which is on the barrier layer 104, 204 and which fills the space between the gate sidewall spacers 108s-108d, 208s-208d. The second gate section 122, 222 can include a second gate metal layer 125, 225, which is above the first gate section 121, 221 and specifically immediately adjacent to the top surface of the first gate metal layer 105, 205, which extends laterally onto the gate sidewall spacers 108s-108d, 208s-208d and which fills the space between the dielectric liners 198s-198d, 298s-298d. In these embodiments, the first gate metal layer 105, 205 can be a refractive metal or metal alloy layer with a first melting point and first resistance. For example, the first gate metal layer 105, 205 can be a titanium nitride layer, a tantalum nitride layer, or some other suitable refractive metal or metal alloy layer. The second gate metal layer 125, 225 can be a different metal or metal alloy material than the first gate metal layer 105, 205 with a second melting point that is less than the first melting point and with a second resistance that is less than the first resistance. For example, the second gate metal layer 125, 225 can be aluminum, copper, or some other suitable low resistance metal or metal alloy. As discussed in greater detail below with regard to the method embodiments, for these structures, the first gate metal layer 105, 205 of the first gate section 121, 221 is deposited prior to source/drain metal deposition (e.g., ohmic metal deposition) and high temperature anneal. Since the first gate metal layer 105, 205 has a relatively high melting point, it can withstand the high temperature anneal. The second gate metal layer 125, 225 of the second gate section 122, 222 is formed following the source/drain metal deposition and high temperature anneal.

Alternatively, e.g., as illustrated in the gate 120B of the transistor 100B and in the gate 220B of the transistor 200B, during processing a gate opening can be formed and this gate opening can include an upper portion, which is created (as discussed in greater detail below regarding the method embodiments) by etching a recess in dielectric material to form the dielectric liners 198s-198d, 298s-298d and expose a sacrificial gate material layer between the gate sidewall spacers 108s-108d, 208s-208d, and a lower portion, which is created (also as discussed in greater detail below regarding the method embodiments) by removing the sacrificial gate material. A conformal first gate material layer 124, 224 lines the lower and upper portions of gate opening and a second gate metal layer 125, 225 fills the remaining space within the gate opening. In these embodiments, the conformal first gate metal layer 124, 224 can be a refractive metal or metal alloy layer (e.g., a titanium nitride layer, a tantalum nitride layer, or some other suitable refractive metal or metal alloy layer) or, alternatively, any other suitable metal or metal alloy liner material. The second gate metal layer 125, 225 can be a different metal or metal alloy material with a lower resistance that the metal or metal alloy material used for the conformal first gate metal layer. For example, the second gate metal layer 125, 225 can be aluminum, copper or some other suitable low resistance metal or metal alloy. In this case, the lined and filled lower portion of the gate opening corresponds to the first gate section and the lined and filled upper portion of the gate opening corresponds to the second gate section. As discussed in greater detail below with regard to the method embodiments, for these structures, the sacrificial gate material layer is formed prior to source/drain metal deposition (e.g., ohmic metal deposition) and high temperature anneal and it serves as a placeholder for the first gate section. Deposition of the first and second gate metal layers for formation of the gate structure (including concurrent formation of both the first gate section and the second gate section) occurs following the source/drain ohmic metal deposition and high temperature anneal.

In each of the embodiments, the first gate metal layer of the first gate section 121, 221 of the gate 120A, 120B, 220A, 220B can be positioned above and immediately adjacent to the top surface of the barrier layer 104, 204 such that the transistor 100A, 100B, 200A, 200B is a III-V high electron mobility transistor (HEMT). Alternatively, the gate 120A, 120B, 220A, 220B can include an optional gate dielectric layer 129, 229 (e.g., as indicated by the shape with the dashed line), which separates the first gate metal layer of the first gate section 121, 221 from the barrier layer 104, 204 such that the transistor 100A, 100B, 200A, 200B is a III-V metal-insulator-semiconductor HEMT (MISHEMT). It should be noted that, depending upon the processing techniques used, placement of this optional gate dielectric layer 129, 229 can vary. For example, the optional gate dielectric layer 129, 229 could be at the bottom of the first gate section 121, 221 only (as illustrated), could line the entire gate opening (e.g., in the transistor 100B, 200B only), or could be aligned above all barrier layer sections. The gate dielectric layer 129, 229 could be, for example, a silicon nitride gate dielectric layer, an aluminum oxide gate dielectric layer or a layer of any other suitable gate dielectric material.

In any case, in each of the embodiments, the transistor 100A, 100B, 200A, 200B can further include a source terminal 115s, 215s and a drain terminal 115d, 215d.

As mentioned above, in some embodiments (e.g., see the transistor 100A of FIG. 1A and 100B of FIG. 1B), the transistor can be symmetrical (or close thereto) with a self-aligned gate 120A, 120B and self-aligned source and drain terminals 115s-115d, where the source and drain terminals 115s-115d are separated from the gate 120A, 120B by essentially the same separation distances.

In the transistor 100A of FIG. 1A and the transistor 100B of FIG. 1B, the source terminal 115s can include a first source region 115sl (also referred to herein as a lower source region) that extends through a spacer material layer 108 and further through the barrier layer 104 to the channel layer 103. In some embodiments, a source opening can extend through the spacer material layer 108 and further through the barrier layer 104 to the channel layer 103 and the first source region 115sl can be contained within the source opening and can be immediately adjacent to the channel layer 103 at the bottom of the source opening, as illustrated. In other embodiments, the source opening can land on the barrier layer 104 and the first source region 115sl can include source/drain metal within the source opening and also a portion of the barrier layer 104, which is immediately adjacent to the bottom of the source opening and into which source/drain metal material has diffused following anneal process(es) such that the first source region 115sl also extends through the barrier layer 104 to the channel layer 103. In any case, this first source region 115sl can have a proximal portion adjacent to the source-side gate sidewall spacer 108s and a distal portion away from the source-side gate sidewall spacer. The source terminal 115s can also include a second source region 115su (also referred to herein as an upper source region), which is on the distal portion only of the first source region 115sl and which further extends laterally away from the gate 120A, 120B onto the top surface of the spacer material layer 108 (e.g., to form a step or Z-shape source terminal). Optionally, the first source region 115sl can be thinner than the second source region 115su, as measured in a direction essentially perpendicular to the bottom surface of the substrate. The source-side dielectric liner 198s can be above and immediately adjacent to the top surface of the proximal portion of the first source region 115sl and can be positioned laterally between and immediately adjacent to the second gate section 122 and the second source region 115su. Thus, the source-side gate sidewall spacer 108s and the source-side dielectric liner 198s electrically isolate the gate 120A, 120B from the source terminal 115s. Optionally, the source-side dielectric liner 198s can also include a horizontal portion that extends laterally over the top surface of the source terminal 115s and, particularly, over the top of the second source region 115su.

Additionally, in the transistor 100A of FIG. 1A and the transistor 100B of FIG. 1B, the drain terminal 115d can be similarly configured. That is, the drain terminal 115d can include a first drain region 115dl (also referred to herein as a lower drain region) that extends through the spacer material layer 108 and further through the barrier layer 104 to the channel layer 103. The drain opening can be separated from the first gate section by the same separation distance as the source opening. As with the first source region 115sl, in some embodiments, a drain opening can extend through the spacer material layer 108 and further through the barrier layer 104 to the channel layer 103 and the first drain region 115dl can be contained within the drain opening and can be immediately adjacent to the channel layer 103 at the bottom of the drain opening, as illustrated. In other embodiments, the drain opening can land on the barrier layer 104 and the first drain region 115dl can include source/drain metal within the drain opening and also a portion of the barrier layer 104, which is immediately adjacent to the bottom of the drain opening and into which source/drain metal material has diffused following anneal process(es) such that the first drain region 115dl also extends through the barrier layer 104 to the channel layer 103.

In any case, the first drain region 115dl can have a proximal portion adjacent to the drain-side gate sidewall spacer 108d and a distal portion away from the drain-side gate sidewall spacer. The drain terminal 115d can also include a second drain region 115du (also referred to herein as an upper drain region), which is on the distal portion only of the first drain region 115dl and which further extends laterally away from the gate 120A, 120B onto the top surface of the spacer material layer 108 (e.g., to form a step or Z-shape drain terminal). Optionally, the first drain region 115dl can be thinner than the second drain region 115du, as measured in a direction essentially perpendicular to the bottom of the substrate. The drain-side dielectric liner 198d can be above and immediately adjacent to the top surface of the proximal portion of the first drain region 115dl and can be positioned laterally between and immediately adjacent to the second gate section 122 and the second drain region 115du. Thus, the drain-side gate sidewall spacer 108d and the drain-side dielectric liner 198d electrically isolate the gate 120A, 120B from the drain terminal 115d. Optionally, the drain-side dielectric liner 198d can also include a horizontal portion that extends laterally over the top surface of the drain terminal 115d and, particularly, over the top of the second drain region 115du.

Due to the techniques used to form the transistor 100A of FIG. 1A and the transistor 100B of FIG. 1B (as discussed in greater detail below with regard to the method embodiments), source and drain openings are similar in size and shape and separated from the first gate section 121 by essentially the same separation distances. Additionally, the source and drain terminals 115s-115d (including the lower and upper regions thereof) are similar in size and shape and separated from the first gate section 121 by essentially the same separation distances. It should be noted that, while alignment tolerances may result in one of these two terminals 115s-115d being slightly wider than the other (as measured in a direction essentially parallel to the bottom surface of the substrate), the top surfaces of the first source region 115sl and the first drain region 115dl will be essentially co-planar and the top surfaces of the second source region 115*su* and the second drain region 115*du* will also be essentially co-planar.

As mentioned above, in other embodiments (e.g., see the transistor 200A of FIG. 2A and 200B of FIG. 2B), the transistor can be asymmetrical with a self-aligned gate 220A, 220B, a self-aligned source terminal 215*s*, and a non-self-aligned drain terminal 215*d*, where the source and drain terminals 215*s*-215*d* are separated from the gate 220A, 220B by different separation distances and, more particularly, where the drain terminal 215*d* is separated from the gate by a greater separation distance than the source terminal 215*s*.

In the transistor 200A of FIG. 2A and the transistor 200B of FIG. 2B, the source terminal 215*s* is configured essentially the same as the source terminal of the previously described embodiments. That is, the source terminal 215*s* can include a first source region 215*sl* (also referred to herein as a lower source region) that extends through a spacer material layer 208 and further through the barrier layer 204 to the channel layer 203. In some embodiments, a source opening can extend through the spacer material layer 208 and further through the barrier layer 204 to the channel layer 203 and the first source region 215*sl* can be contained within the source opening and can be immediately adjacent to the channel layer 203 at the bottom of the source opening, as illustrated. In other embodiments, the source opening can land on the barrier layer 204 and the first source region 215*sl* can include source/drain metal within the source opening and also a portion of the barrier layer 204, which is immediately adjacent to the bottom of the source opening and into which source/drain metal material has diffused following anneal process(es) such that the first source region 215*sl* also extends through the barrier layer 204 to the channel layer 203. In any case, this first source region 215*sl* can have a proximal portion adjacent to the source-side gate sidewall spacer 208*s* and a distal portion away from the source-side gate sidewall spacer. The source terminal 215*s* can also include a second source region 215*su* (also referred to herein as an upper source region), which is on the distal portion only of the first source region 215*sl* and which further extends laterally away from the gate 220A, 220B onto the top surface of the spacer material layer 208 (e.g., to form a step or Z-shape source terminal). Optionally, the first source region 215*sl* can be thinner than the second source region 215*su*, as measured in a direction essentially perpendicular to the bottom surface of the substrate. The source-side dielectric liner 298*s* can be above and immediately adjacent to the top surface of the proximal portion of the first source region 215*sl* and can be positioned laterally between and immediately adjacent to the second gate section 222 and the second source region 215*su*. Thus, the source-side gate sidewall spacer 208*s* and the source-side dielectric liner 298*s* electrically isolate the gate 220A, 220B from the source terminal 215*s*. Optionally, the source-side dielectric liner 298*s* can also include a horizontal portion that extends laterally over the top surface of the source terminal 215*s* and, particularly, over the top of the second source region 215*su*.

In the transistor 200A of FIG. 2A and the transistor 200B of FIG. 2B, the drain terminal 215*d* can include a first drain region 215*dl* (also referred to herein as a lower drain region), which is separated from the first gate section by a greater distance than the first source region 215*sl* and which extends through the spacer material layer 208 and further through the barrier layer 204 to the channel layer 203. In some embodiments, a drain opening can extend through the spacer material layer 208 and further through the barrier layer 204 to the channel layer 203 and the first drain region 215*dl* can be contained within the drain opening and can be immediately adjacent to the channel layer 203 at the bottom of the drain opening, as illustrated. In other embodiments, the drain opening can land on the barrier layer 204 and the first drain region 215*dl* can include source/drain metal within the drain opening and also a portion of the barrier layer 204, which is immediately adjacent to the bottom of the drain opening and into which source/drain metal material has diffused following anneal process(es) such that the first drain region 215*dl* also extends through the barrier layer 204 to the channel layer 203. In any case, this first drain region 215*dl* can be positioned laterally adjacent to the L-shaped drain-side gate sidewall spacer. The drain terminal 215*d* can also include a second drain region 215*du* (also referred to herein as an upper drain region), which is on the first drain region 215*dl* and which further extends laterally away from the gate 220A, 220B onto the top surface of the spacer material layer 208. Optionally, the first drain region 215*dl* can be thinner than the second drain region 215*du*, as measured in a direction essentially perpendicular to the bottom surface of the substrate. The drain-side dielectric liner 298*d*, which is wider than the source-side dielectric liner 298*s*, can be above and immediately adjacent to the top surface of the horizontal portion of the L-shaped drain-side gate sidewall spacer 208*d* and can be positioned laterally between and immediately adjacent to the second gate section 222 and the second drain region 215*du*. Thus, the drain-side gate sidewall spacer 208*d* and the drain-side dielectric liner 298*d* electrically isolate the gate 220A, 220B from the drain terminal 215*d*. Optionally, the drain-side dielectric liner 298*d* can also include a horizontal portion that extends laterally over the top surface of the drain terminal 115*d* and, particularly, over the top of the second drain region 215*du*.

Due to the techniques used to form the transistor 200A of FIG. 2A and the transistor 200B of FIG. 2B (as discussed in greater detail below with regard to the method embodiments), the source and drain openings and, thus, the first source region 215*sl* and the first drain region 215*dl* are separated from the first gate section 221 by different separations distances. Additionally, the second drain region 215*du* can be positioned above a distal portion of the first drain region 215*dl* only with the drain-side dielectric liner 298*d* extending onto the proximal portion so that the drain terminal 215*d* is a step or Z-shape drain terminal (as illustrated). Alternatively, the second drain region 215*du* could extend across the entire first drain region 215*dl* so as to form, for example, a T-shaped drain terminal or an inverted L-shaped terminal, etc. (not shown).

As mentioned above and illustrated in FIGS. 1A-1B and 2A-2B, optionally, the source-side and drain-side dielectric liners 198*s*-198*d*, 298*s*-298*d* can include horizontal portions that extend laterally over the top surfaces of the source and drain terminals 115*s*-115*d*, 215*s*-215*d*, respectively. In this case, the top surface of the gate 120A, 120B, 220A, 220B can be essentially co-planar with the top surfaces of the horizontal portions of the dielectric liners 198*s*-198*d*, 298*s*-298*d* and, thus, the top surface of the gate 120A, 120B, 220A, 220B will be above the level of the top surfaces of the source and drain terminals 115*s*-115*d*, 215*s*-215*d*. Alternatively, the top surfaces of the gate, the source terminal, and the drain terminal could be essentially co-planar (e.g., due to chemical mechanical polishing (CMP) during processing) (not shown).

In any case, in each of the embodiments, the first source region and the second source region of the source terminal 115s, 215s can include continuous portions of the same source/drain metal layer 112, 212. Similarly, the first drain region and the second drain region of the drain terminal 115d, 215d can include continuous portions of the source/drain metal layer 112, 212. The source and drain terminals 115s-115d, 215s-215d for HEMT or MISHEMT transistors should be ohmic contact source/drain terminals at the metal-semiconductor junction at the bottom of the source/drain opening. Thus, the source/drain metal layer 112, 212 can include one or more layers of ohmic metal or metal alloys. For example, the source/drain metal layer 112, 212 could include layers of Ti/Al/TiN, layers of Ti/Al/Ti/Au or layers of Mo/Al/Mo/Au.

Also disclosed herein are method embodiments for forming the above-described transistor embodiments.

Figure 3:
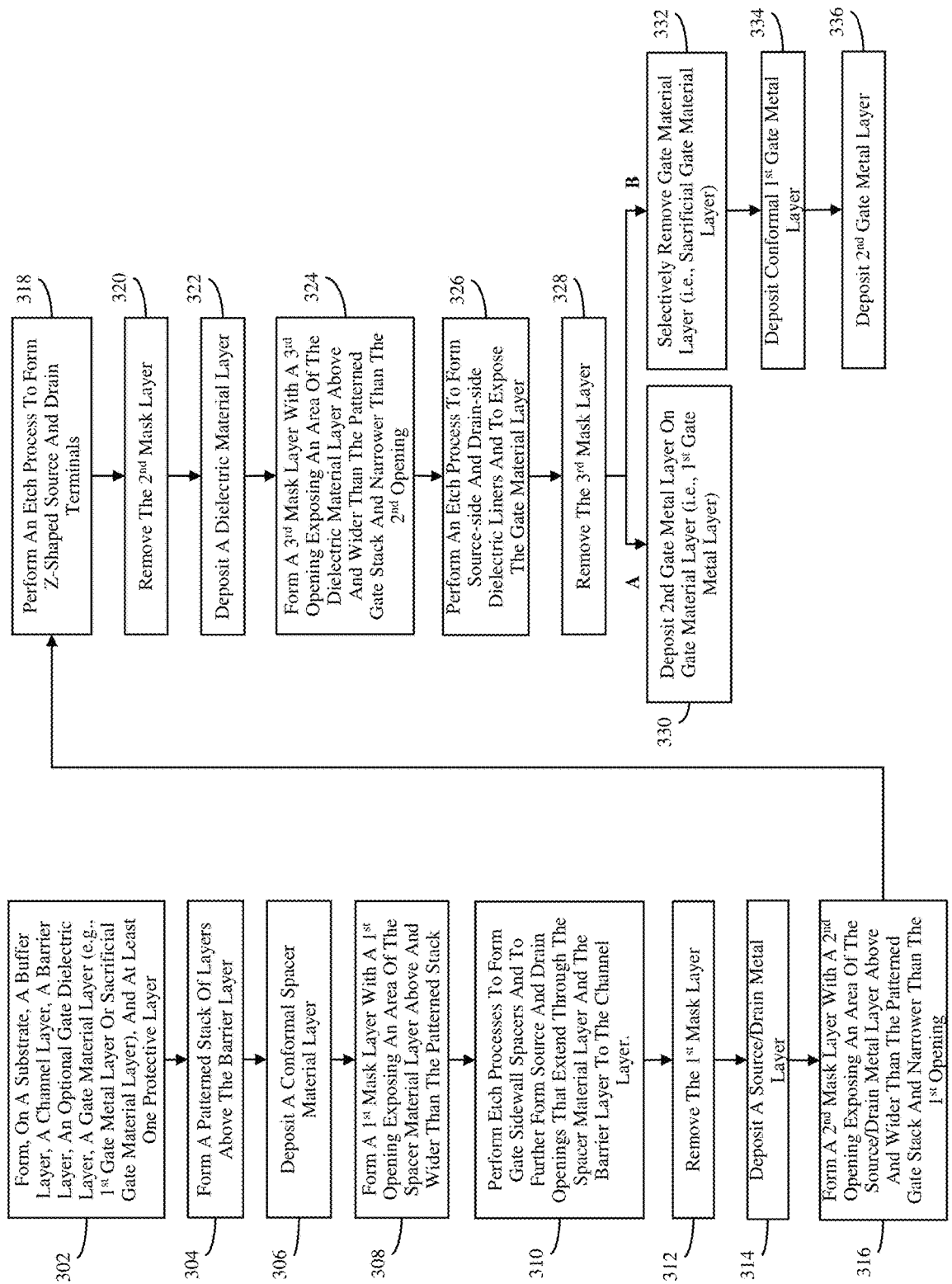
FIG. 3 is a flow diagram illustrating method embodiments for forming the transistors shown in FIGS. 1A and 1B.
Figure 4:
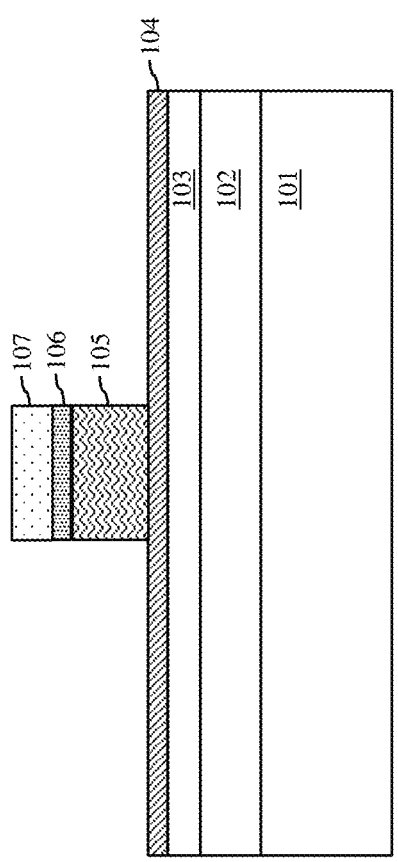
FIGS. 4(1)-4(11) are cross-section diagrams of partially completed transistor structures formed according to the flow diagram of FIG. 3.
Figure 4:
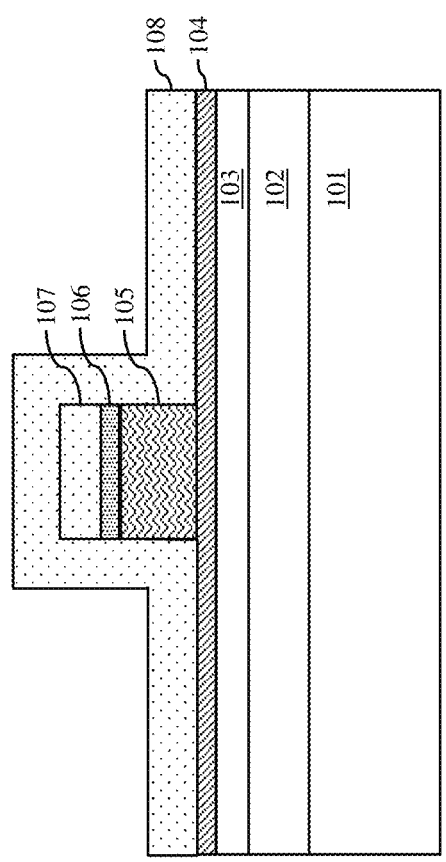
Figure 4:
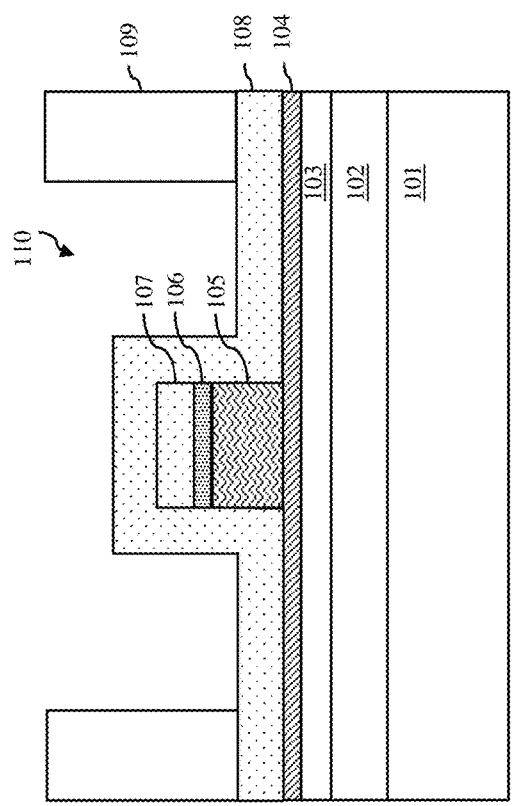
Figure 4:
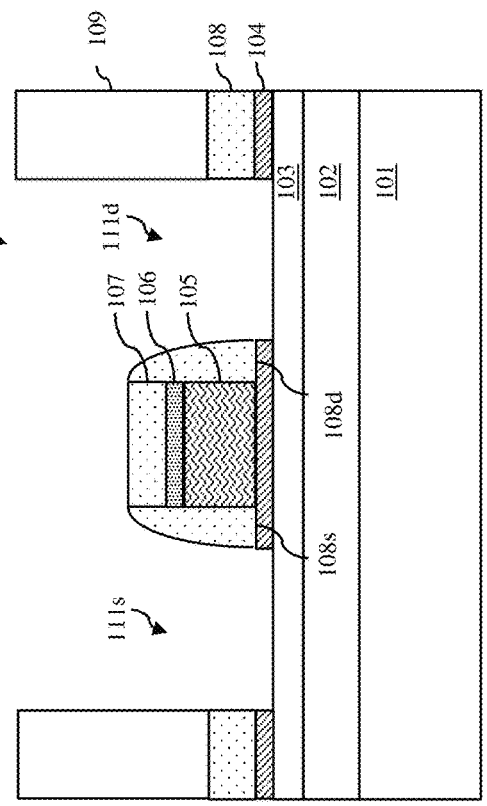
Figure 4:
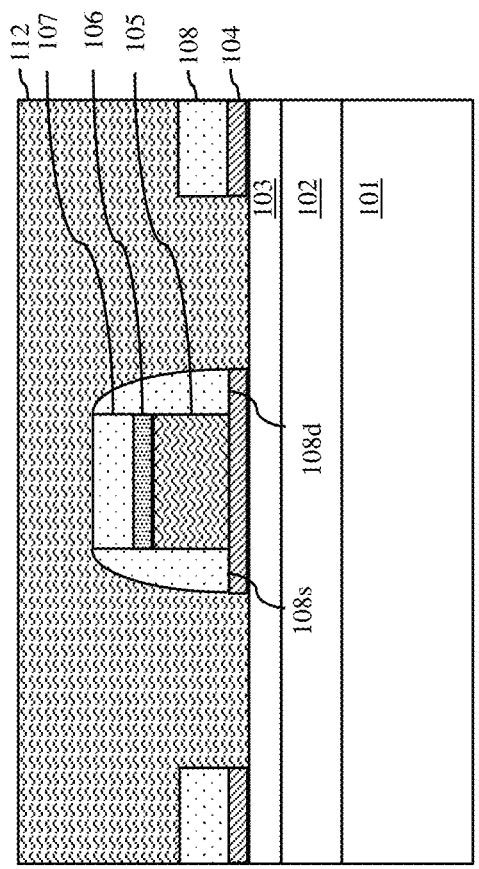
Figure 4:
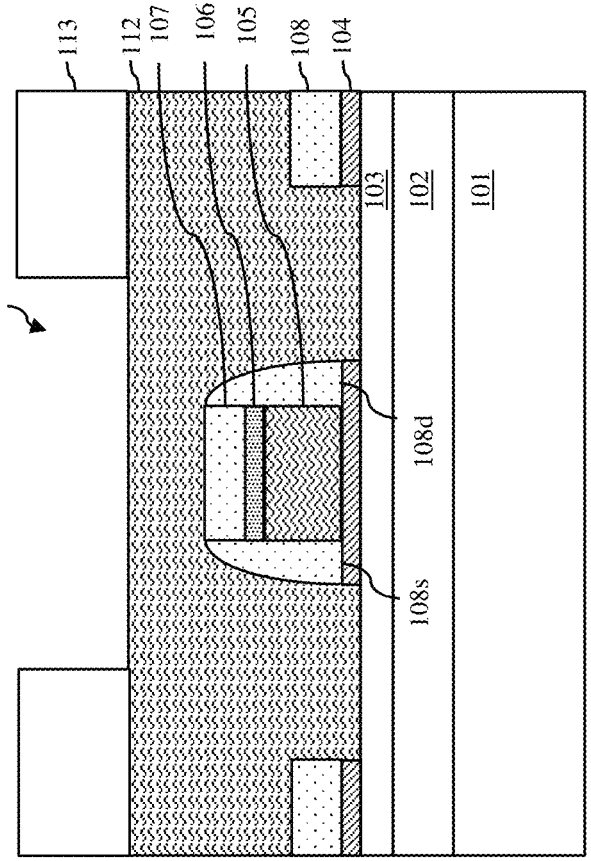
Figure 4:
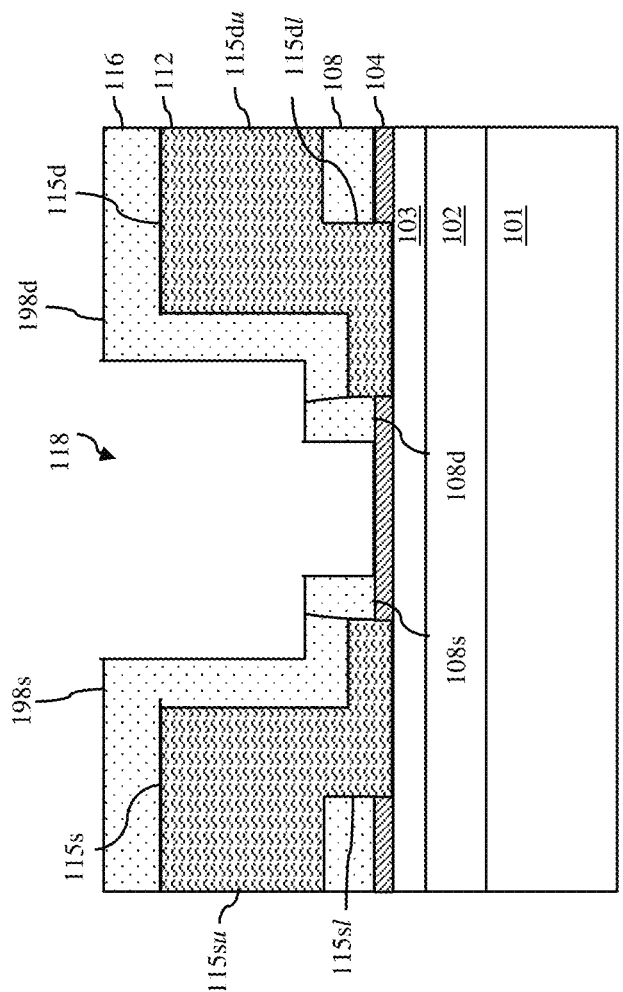
Figure 5:
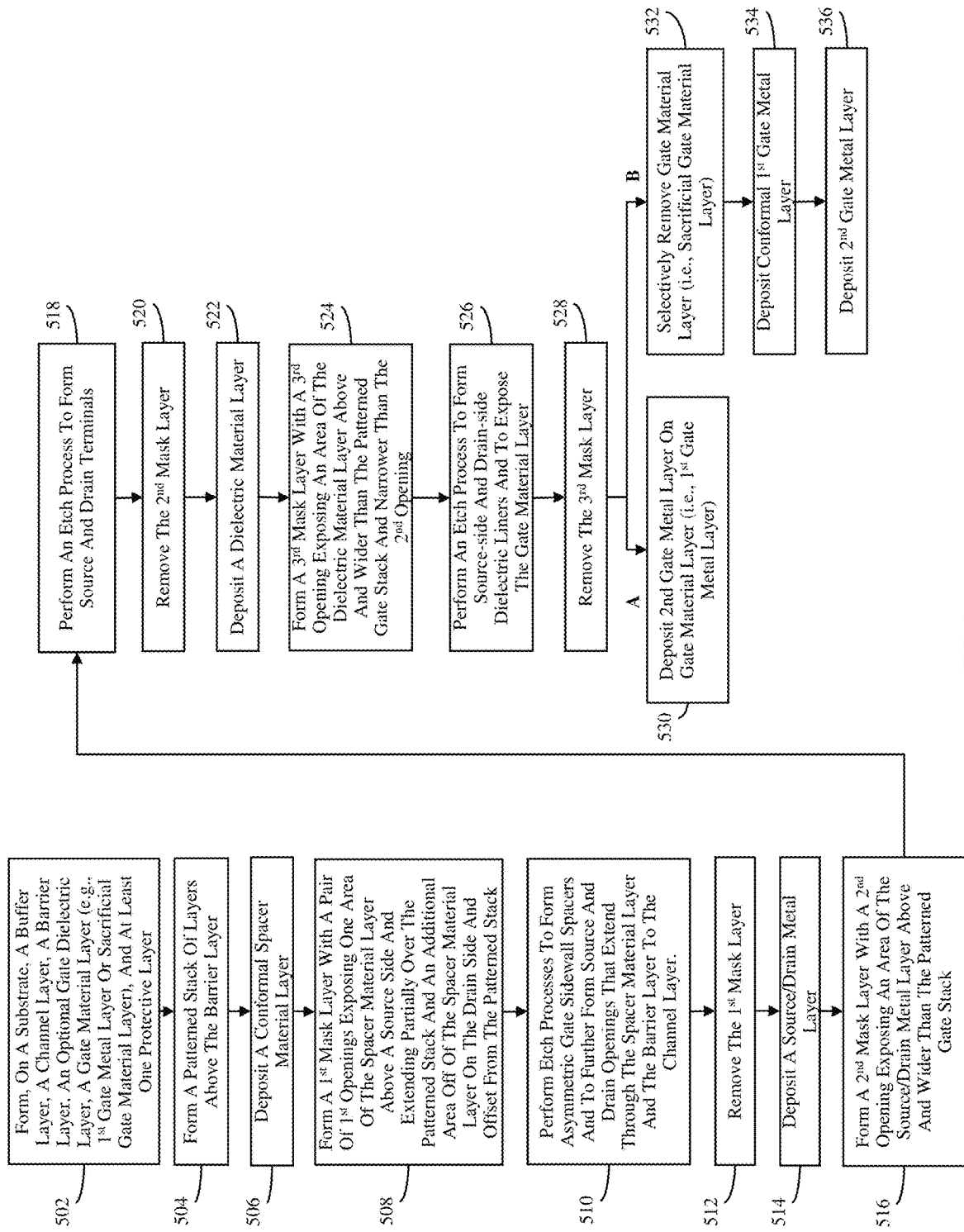
FIG. 5 is a flow diagram illustrating method embodiments for forming the transistors shown in FIGS. 2A and 2B.
Figure 6:
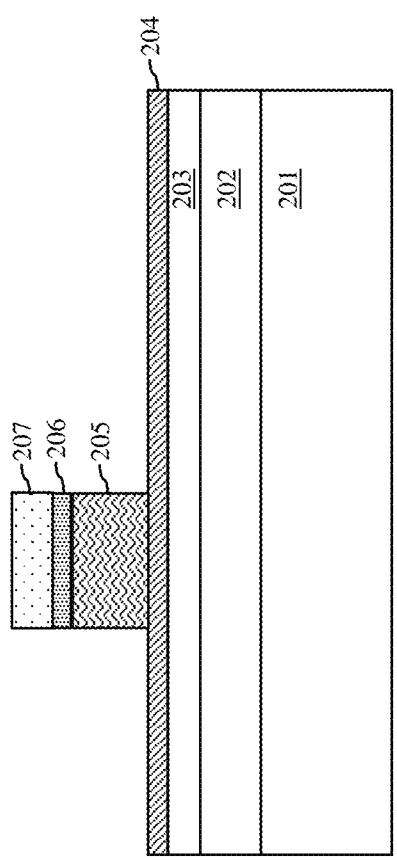
FIGS. 6(1)-6(11) are cross-section diagrams of partially completed transistor structures formed according to the flow diagram of FIG. 5.
Figure 6:
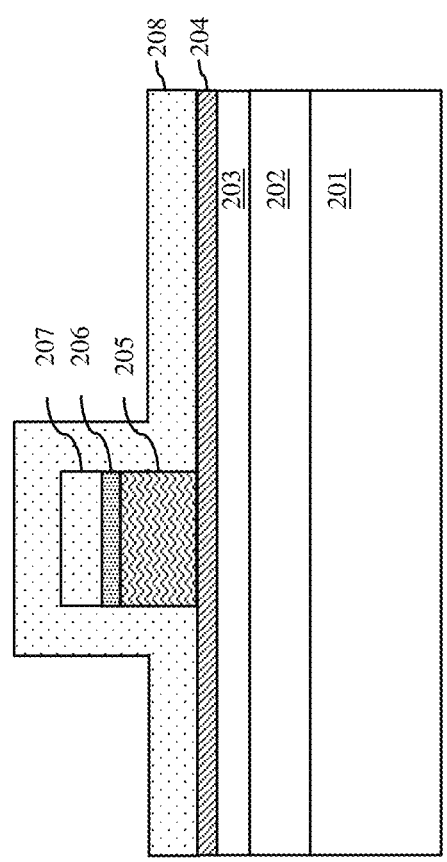
Figure 6:
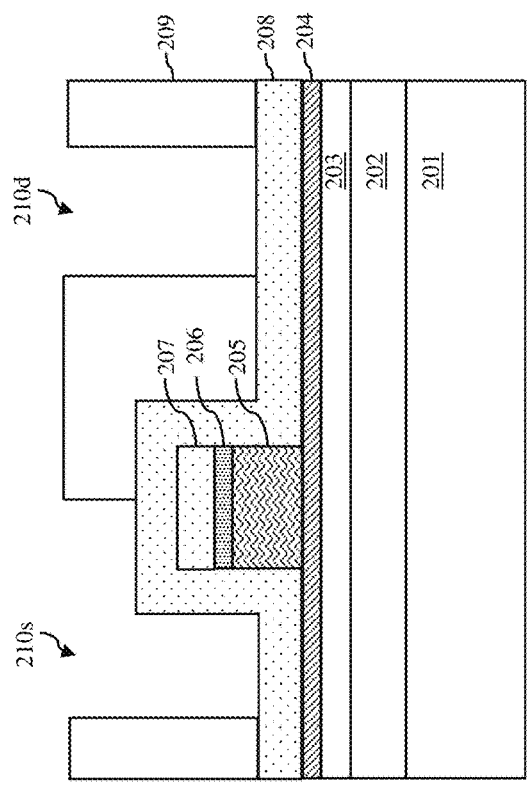
Figure 6:
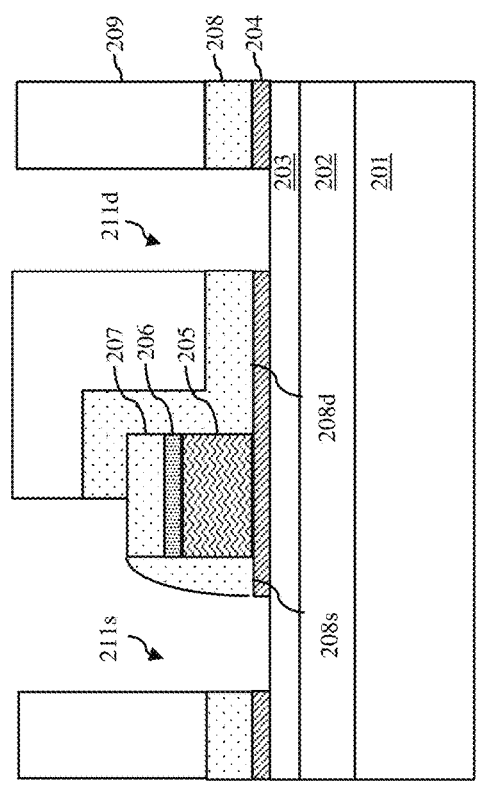
Figure 6:
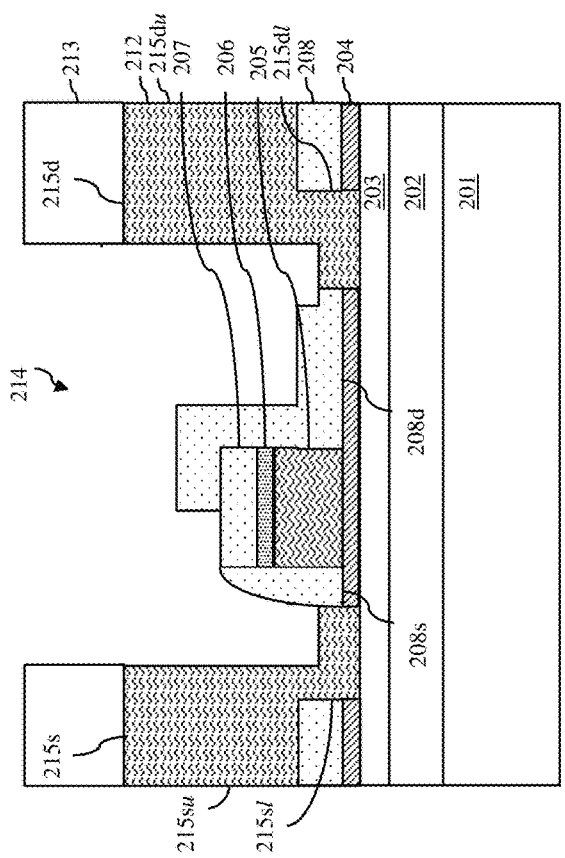
Figure 6:
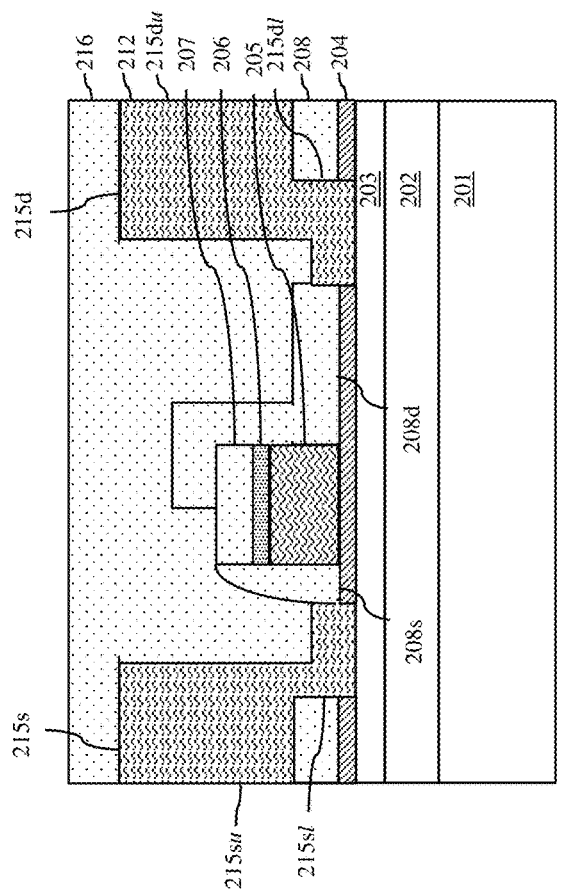
Figure 6:
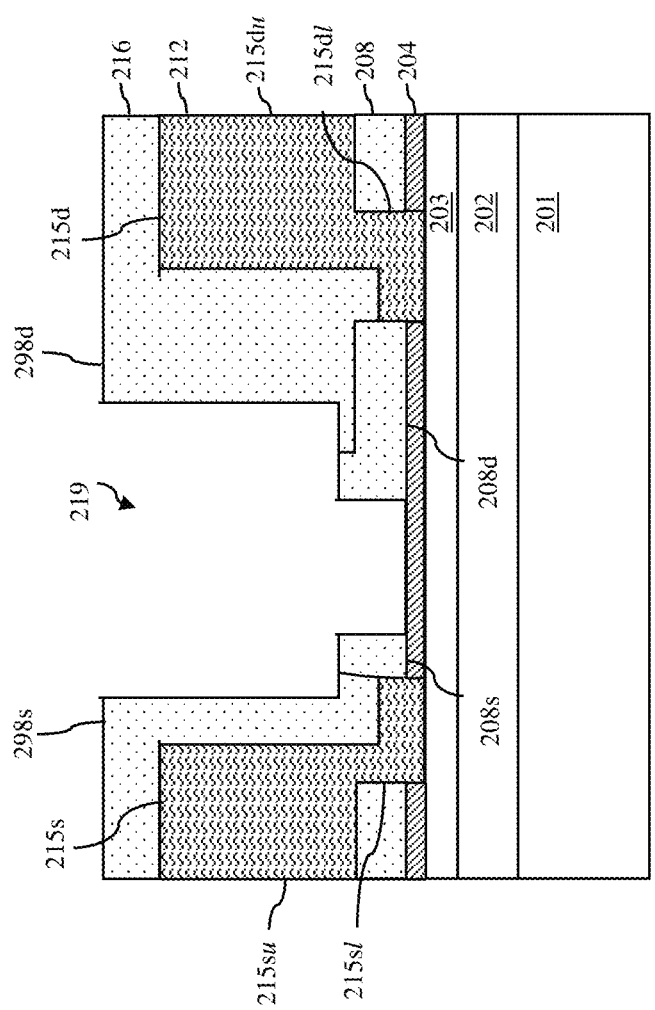

More specifically, FIG. 3 is a flow diagram illustrating method embodiments for forming the transistors 100A and 100B shown in FIGS. 1A and 1B, respectively. FIGS. 4(1)-4(11) are cross-section diagrams of partially completed transistor structures formed according to the flow diagram of FIG. 3. FIG. 5 is a flow diagram illustrating method embodiments for forming the transistors 200A and 200B shown in FIGS. 2A and 2B, respectively. FIGS. 6(1)-6(11) are cross-section diagrams of partially completed transistor structures formed according to the flow diagram of FIG. 5.

Each of the method embodiments can include forming multiple epitaxial semiconductor layers 102-104, 202-204 on a semiconductor substrate 101, 201 and further forming multiple additional layers 105-107, 205-207 above the epitaxial semiconductor layers (see process 302 of FIG. 3 and FIG. 4(1); see also process 502 of FIG. 5 and FIG. 6(1)).

The semiconductor substrate 101, 201 can be, for example, a silicon or silicon-based substrate (e.g., a silicon carbide (SiC) substrate), a sapphire substrate, a III-V semiconductor substrate (e.g., a gallium nitride (GaN) substrate or some other suitable III-V semiconductor substrate) or any other suitable substrate for a III-V semiconductor device.

The epitaxially semiconductor layers can include, for example: an optional buffer layer 102, 202 on the top surface of the semiconductor substrate 101, 201; a channel layer 103, 203 on the buffer layer 102, 202; and a barrier layer 104, 204 on the channel layer 103, 203. These epitaxial grown semiconductor layers can be, for example, III-V semiconductor layers. Those skilled in the art will recognize that a III-V semiconductor refers to a compound obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP).

The optional buffer layer 102, 202 can be employed to facilitate growth of the channel layer 103, 203 and to provide for lattice constants of the substrate 101, 201 below and the channel layer 103 above. The buffer layer 102, 202 can be doped or undoped. Optionally, the buffer layer 102, 202 can be carbon-doped. The barrier layer 104, 204 can have a band gap that is wider than the bandgap of the channel layer 103, 203 for the device channel. Those skilled in the art will recognize that the barrier and channel materials can be selected so that a heterojunction is formed at the interface between the two layers, thereby resulting in the formation of a two-dimensional electron gas (2DEG) in the channel layer 103, 203. This 2DEG in the channel layer 103, 203 can provide the conductive pathway for the drifting of charges between the source and the drain.

In some embodiments, the buffer layer 102, 202 could be a carbon-doped gallium nitride (C—GaN) buffer layer or a buffer layer of any other material suitable for use as a buffer layer of a HEMT or MISHEMT. The channel layer 103, 203 could be a gallium nitride (GaN) layer or a III-V semiconductor channel layer made of any other III-V semiconductor compound suitable for use as a channel layer in a HEMT or MISHEMT. The barrier layer 104, 204 could be an aluminum gallium nitride (AlGaN) barrier layer or a barrier layer of any other material suitable for use as a barrier layer in a HEMT or MISHEMT.

For purposes of illustration, the figures and the description above depict the epitaxially grown layers (e.g., the buffer layer 102, 202; the channel layer 103, 203; and the barrier layer 104, 204) as being single layered structures (i.e., comprising one layer of buffer material, one layer of channel material and one layer of barrier material). However, it should be understood that, alternatively, any one or more of the epitaxially grown layers could be multi-layered structures (e.g., comprising multiple sub-layers of different buffer materials, multiple sub-layers of different III-V semiconductor channel materials and/or multiple sub-layers of different barrier materials).

The additional layers can include an optional gate dielectric layer (not shown). The gate dielectric layer 129, 229 could be, for example, a silicon nitride gate dielectric layer, an aluminum oxide gate dielectric layer or a layer of any other suitable gate dielectric material.

The additional layers can include a gate material layer 105, 205. In some embodiments (e.g., embodiments used to form the transistor 100A of FIG. 1A or the transistor 200A of FIG. 2A), the gate material layer can be a first gate metal layer. This first gate metal layer can be, for example, a refractive metal or metal alloy layer with a first melting point and first resistance. For example, the first gate metal layer can be a titanium nitride layer, a tantalum nitride layer, or some other suitable refractive metal or metal alloy layer. In other embodiments (e.g., embodiments used to form the transistor 100B of FIG. 1B or the transistor 200B of FIG. 2B), the gate material layer can be a sacrificial gate material layer.

The additional layers can further include one or more protective layers. The protective layers can include, for example, an etch stop layer 106, 206, such as a silicon nitride layer, and a silicon dioxide layer 107, 207 on the etch stop layer 106, 206.

Each of the method embodiments can include forming a patterned stack of layers above the barrier layer 104, 204 (see process 304 of FIG. 3 and FIG. 4(1); see also process 504 of FIG. 5 and FIG. 6(1)). Specifically, conventional lithographic patterning and etch techniques can be performed in order to include a patterned stack (also referred to herein as an initial gate stack), which at least includes, above the barrier layer, the gate material layer 105, 205 and the protective layers 106-107, 206-207. It should be noted that if the additional layers formed at process 302, 502 include the gate dielectric layer the etch process could be performed so that the patterned stack includes the gate dielectric layer or, alternatively, so that the patterned stack is above the gate dielectric layer.

In any case, each of the method embodiments can include depositing a conformal spacer material layer 108, 208 over the partially completed structure (see process 306 of FIG. 3 and FIG. 4(2); see also process 506 of FIG. 5 and FIG. 6(2)). This conformal spacer material layer can be, for example, a conformal silicon dioxide layer. Alternatively, this conformal spacer material layer could include one or more conformal layers of suitable isolation materials (e.g., a thin conformal silicon nitride layer and a thicker conformal silicon dioxide layer on the thin conformal silicon nitride layer).

Each of the method embodiments can further include forming a first mask layer 109, 209 on the spacer material layer 108, 208 (see process 308 of FIG. 3 and FIG. 4(3); see also process 508 of FIG. 5 and FIG. 6(3)). The first mask layer can be patterned with one or more first openings that will be used during formation of source and drain openings.

More specifically, in some embodiments (e.g., embodiments used to form the transistor 100A of FIG. 1A or the transistor 100B of FIG. 1B) the first mask layer 109 formed at process 308 can be lithographically patterned and etched so as that it has a first opening 110, which extends vertically therethrough to the spacer material layer 108. The first opening 110 can be patterned and etched, for example, such that it is essentially center-aligned above the patterned stack and such that it exposes an area of the spacer material layer 108 above and wider than the patterned stack, as illustrated in FIG. 4(3).

In other embodiments (e.g., embodiments used to form the transistor 200A of FIG. 2A or the transistor 200B of FIG. 2B) the first mask layer 209 formed at process 508 can be lithographically patterned and etched so as that it has a pair of first openings 210s-210d, which extend vertically therethrough to the spacer material layer 208. One first opening 210s can be patterned and etched, for example, such that it exposes an area of the spacer material layer 208 on one side (e.g., the source side) of the patterned stack and extending partially over the patterned stack and another first opening 210d can be patterned and etched, for example, such that it exposes an additional area of the spacer material layer 208 on the opposite side of the patterned stack (e.g., on the drain side) and completely offset from the patterned gate stack, as illustrated in FIG. 6(3).

Each of the method embodiments can further include performing etch processes through the first opening(s) in the first mask layer 109, 209 in order to form gate sidewall spacers 108s-108d, 208s-208d from the spacer material layer 108, 208 and to further form a source opening and a drain opening, which are on opposite sides of the patterned stack and which extend completely through the spacer material layer 108, 208 and, optionally, the barrier layer 104, 204 to the channel layer 103, 203 (see process 310 of FIG. 3 and FIG. 4(4); see also process 510 of FIG. 5 and FIG. 6(4)). For purposes of illustration, etching of the source and drain openings through both the spacer material layer and the barrier layer is shown and described below.

More specifically, as mentioned above, in some embodiments (e.g., embodiments used to form the transistor 100A of FIG. 1A or the transistor 100B of FIG. 1B) the first opening 110 in the first mask layer 109 exposes a continuous area of the spacer material layer 108, which covers the patterned stack and which also extends laterally over the barrier layer 104 on either side of the patterned stack. In these embodiments, a selective anisotropic etch process can be performed in order to remove any exposed horizontal portions of the spacer material layer 108, leaving essentially intact any exposed vertical portions and any other portions protected by the first mask layer 109. Thus, the anisotropic etch process will result in the formation of essentially symmetrical gate sidewall spacers 108s-108d on opposing sides of the patterned stack and will further expose portions on the barrier layer 104 on the source side and drain side of the patterned stack. An additional anisotropic etch process can be performed to remove the exposed portions of the barrier layer 104, thereby completing formation of the source and drain openings 111s-111d. It should be noted, if a gate dielectric layer is formed immediately above the barrier layer at process 302 and not etched during formation of the patterned stack at process 304, then this gate dielectric layer will be exposed when the spacer material layer is etched. In this case, two additional anisotropic etch processes can be performed to remove exposed portions of the gate dielectric layer and then the barrier layer, thereby forming the source and drain openings. In any case, the resulting source and drain openings 111s-111d will be separated from the patterned gate stack by essentially the same separation distances due to the symmetric gate sidewall spacers 108s-108d, as shown in FIG. 4(4).

Also, as mentioned above, in other embodiments (e.g., embodiments used to form the transistor 200A of FIG. 2A or the transistor 200B of FIG. 2B) a pair of first openings 210s-d expose two discrete areas of the spacer material layer 208, one area of the spacer material layer 208 on the source side of the patterned stack and further extending partially over the patterned stack and another area of the spacer material layer 208 on the drain side of the patterned stack and completely offset from the patterned stack. Thus, one portion of the spacer material layer that covers the patterned stack is unprotected by the first mask layer 209 and another portion of the spacer material layer that covers the patterned stack is protected by the first mask layer 209. In these embodiments, a selective anisotropic etch process can be performed in order to remove any exposed horizontal portions of the spacer material layer 208, leaving essentially intact any exposed vertical portion and any other portions protected by the first mask layer 209. Thus, the anisotropic etch process will result in the formation of essentially asymmetrical gate sidewall spacers 208s-208d on opposing sides of the patterned stack and will further expose portions on the barrier layer 204 on the source side and drain side of the patterned stack. Since a vertical portion of the spacer material layer 208 is exposed in opening 210s on the source side of the patterned stack, the resulting source-side gate sidewall spacer 208s will be essentially vertically oriented and portion of the barrier layer 204 immediately adjacent thereto will be exposed. Since the first mask layer 109 protects the spacer material layer 208 on the drain side of the patterned stack and since the opening 210d is offset from the patterned stack, the resulting drain-side gate sidewall spacer 208d will be essentially L-shaped and wider than the source-side gate sidewall spacer 208s and portion of the barrier layer 204 immediately adjacent thereto will be exposed. An additional anisotropic etch process can be performed to remove the exposed portions of the barrier layer 204, thereby completing formation of the source and drain openings 211s-211d. As with the previously described embodiment, if a gate dielectric layer is formed immediately above the barrier layer at process 502 and not etched during formation of the patterned stack at process 504, then this gate dielectric layer will be exposed when the spacer material layer is etched. In this case, two additional anisotropic etch processes can be performed to remove exposed portions of the gate dielectric layer and then the barrier layer, thereby forming the source and drain openings. In any case, the resulting source and drain openings will be separated from the patterned gate stack by different separation distances due to the asymmetric gate sidewall spacers 208s-208d, as shown in FIG. 6(4).

Each of the method embodiments can further include selectively removing the first mask layer 109, 209 (see process 312 of FIG. 3; see also process 512 of FIG. 5) and forming (i.e., depositing) a source/drain metal layer 112, 212 over the partially completed structure and, particularly, over the patterned stack, filling the source and drain openings 111s-111d, 211s-211d, and covering the remaining portions of the spacer material layer 108, 208 adjacent to the source and drain openings 111s-111d, 211s-211d distal to gate sidewall spacers 108s-108d, 208s-208d (see process 314 of FIG. 3 and FIG. 4(5); see also process 514 of FIG. 5 and FIG. 6(4)). Thus, the source/drain metal layer 112, 212 can include one or more layers of ohmic metal or metal alloys. For example, the source/drain metal layer 112, 212 could include layers of Ti/Al/TiN, layers of Ti/Al/Ti/Au or layers of Mo/Al/Mo/Au.

It should be noted that if the source and drain openings have been etched through the spacer material layer and the barrier layer to the channel layer at process 310, 510, as shown, then the source/drain metal layer 112, 212 deposited at process 314, 514 will be immediately adjacent to the channel layer at the bottom of the source and drain openings. However, if the source and drain openings are only etched through the spacer material layer to the barrier layer at process 310, 510, then the source/drain metal layer 112, 212 will be immediately adjacent to the barrier layer at the bottom of the source and drain openings. In this case, subsequent anneal process(es) will result in source/drain metal material diffusion into the portions of the barrier layer below such that in the resulting structures first source and drain regions (i.e., lower source and drain regions) extend through the barrier layer to the channel region. That is, the lower source and drain regions will include source/drain metal-containing portions of the barrier layer below the source and drain openings and further include the source/drain metal within and at the bottom of the source and drain openings.

Each of the method embodiments can further include forming a second mask layer 113, 213 on the source/drain metal layer 112, 212 (see process 316 of FIG. 3 and FIG. 4(6); see also process 516 of FIG. 5 and FIG. 6(6)). The second mask layer 113, 213 can be patterned with a second opening 114, 214, which exposes an area of the source/drain metal layer 112, 212 over and on either side of the patterned stack.

In some embodiments (e.g., embodiments used to form the transistor 100A of FIG. 1A or the transistor 100B of FIG. 1B) the second opening 114 in the second mask layer 113 can be essentially center-aligned above the patterned stack and smaller in width than the first opening 110 (e.g., as measured in a direction parallel to the bottom surface of the substrate), as illustrated in FIG. 4(6). The second opening 114 should be patterned so that it has one sidewall aligned above the source opening 111s some distance from any remaining spacer material distal to the source-side gate sidewall spacer 108s and so that it has another sidewall aligned above the drain opening 111d some distance from any remaining spacer material distal to the drain-side gate sidewall spacer 108d.

In other embodiments (e.g., embodiments used to form the transistor 200A of FIG. 2A or the transistor 200B of FIG. 2B) the second opening 214 in the second mask layer 213 may not be center-aligned, as illustrated in FIG. 6(6). For example, a greater area of the source/drain metal layer may be exposed on the drain side of the patterned stack as compared to the source side. The second opening 214 should be patterned so that it has one sidewall aligned above the source opening 211s some distance from any remaining spacer material distal to the source-side gate sidewall spacer 208s and so that it has another sidewall ideally aligned above the drain opening 211d some distance from any remaining spacer material distal to the drain-side gate sidewall spacers 208d. However, it should be noted that the sidewall of the second opening 214 in the second mask layer 213 could, optionally, be aligned above the horizontal portion of the L-shaped drain-side gate sidewall spacer.

Each of the method embodiments can further include performing an etch process through the second opening 114, 214 in the second mask layer 113, 213 to recess the source/drain metal layer 112, 212 and thereby form the discrete source and drain terminals 115s-115d, 215s-215d (see process 318 of FIG. 3 and FIG. 4(7); see also process 518 of FIG. 5 and FIG. 6(7)). Specifically, this etch process can be a selective anisotropic etch process, which forms a recess in the source/drain metal layer 112, 212. This selective anisotropic etch process exposes the top of the patterned stack and the gate sidewall spacers 108s-108d, 208s-208d and is stopped prior to exposure of the barrier layer 104, 204 at the bottom of the source and drain openings 111s-111d, 211s-211d.

Thus, in some embodiments (e.g., embodiments used to form the transistor 100A of FIG. 1A or the transistor 100B of FIG. 1B), the resulting source and drain terminals 115s-115d will be essentially step or Z-shaped. That is, the source terminal 115s will have a first source region 115sl (also referred to herein as a lower source region), which is in the source opening 111s positioned laterally adjacent to the source-side gate sidewall spacer 108s, and a second source region 115su (also referred to herein as an upper source region), which is on a distal portion of the first source region and which extends laterally onto spacer material 108 (as illustrated in FIG. 4(7) and discussed above with regard to the transistor structure embodiments). Similarly, the drain terminal 115d will have a first drain region 115dl (also referred to herein as a lower drain region), which is in the drain opening 111d positioned laterally adjacent to the drain-side gate sidewall spacer 108d, and a second drain region 115du (also referred to herein as an upper drain region), which is on a distal portion of the first drain region and which extends laterally onto spacer material 108 (also as illustrated in FIG. 4(7) and discussed above with regard to the transistor structure embodiments).

In other embodiments (e.g., embodiments used to form the transistor 200A of FIG. 2A or the transistor 200B of FIG. 2B), the resulting source terminal 215s will be essentially step or Z-shaped. That is, the source terminal 215s will have a first source region 215sl (also referred to herein as a lower source region), which is in the source opening 211s positioned laterally adjacent to the source-side gate sidewall spacer 208s, and a second source region 215su (also referred to herein as an upper source region), which is on a distal portion of the first source region and which extends laterally onto spacer material 208 (as illustrated in FIG. 6(7) and discussed above with regard to the transistor structure embodiments). However, the resulting drain terminal 215d could be essentially step or Z-shaped (as illustrated). However, alternatively, depending upon where the sidewalls of the second opening 214 in the second mask layer 213 are aligned, the drain terminal 215d could also be essentially T-shaped or inverted L-shaped.

Each of the method embodiments can further include selectively removing the second mask layer 113, 213 (see process 320 of FIG. 3; see also process 520 of FIG. 5) and forming (i.e., depositing) a dielectric material layer 116, 216 over the partially completed structure and, particularly, over the source and drain terminals 115s-115d, 215s-215d and filling the space above the gate sidewall spacers and patterned stack (see process 322 of FIG. 3 and FIG. 4(8); see also process 522 of FIG. 5 and FIG. 6(8)). This dielectric material layer 116, 216 can be, for example, a single blanket dielectric layer (e.g., a blanket silicon dioxide layer). Alternatively, this dielectric material layer 116, 216 could be a multi-layered dielectric layer include one or more conformal layers of different dielectric materials and a blanket layer of dielectric material on the conformal layers.

Each of the method embodiments can further include forming a third mask layer 117, 217 on the dielectric material layer 116, 216 (see process 324 of FIG. 3 and FIG. 4(9); see also process 524 of FIG. 5 and FIG. 6(9)). The third mask layer 117, 217 can be patterned with a third opening 118, 218, which exposes an area of the dielectric material layer 116, 216 over and wider than the patterned stack. The third opening 118, 218 in this third mask layer 117, 217 can be smaller in width the second opening 114, 214 in the second mask layer 113, 213, as measured in a direction essentially parallel to the bottom surface of the substrate. Additionally, the width of the third opening 118, 218 can such that the sidewalls of the third opening 118, 218 are aligned above dielectric material within the space between upper regions of the source and drain terminals and not aligned above the upper regions of the source and drain terminals.

Each of the method embodiments can further include performing an etch process through the third opening 118, 218 in the third mask layer 117, 217 to form a recess 119, 219 in the dielectric material layer 116, 216 within the space between the upper regions of the source and drain terminals (i.e., between the second source region 115$su$, 215$su$ and the second drain region 115$du$, 215$du$) and thereby form discrete source-side and drain-side dielectric liners 198$s$-198$d$, 298$s$-298$d$ and expose the top surface of the gate material layer 105, 205 (see process 326 of FIG. 3 and FIG. 4(10); see also process 526 of FIG. 5 and FIG. 6(10)).

In some embodiments (e.g., embodiments used to form the transistor 100A of FIG. 1A or the transistor 100B of FIG. 1B), the resulting dielectric liners 198$s$-198$d$ can have essentially the same width, as measured in a direction parallel to the bottom surface of the substrate (e.g., see FIG. 4(10)). The source-side dielectric liner 198$s$ can be above a proximal portion of the first source region 115$sl$ such that it is positioned laterally between the second source region 115$su$ and the recess 119. Similarly, drain-side dielectric liner 198$d$ can be above a proximal portion of the first drain region 115$dl$ such that it is positioned laterally between the second drain region 115$du$ and the recess 119.

In other embodiments (e.g., embodiments used to form the transistor 200A of FIG. 2A or the transistor 200B of FIG. 2B), the resulting dielectric liners 298$s$-298$d$ can have different widths, as measured in a direction parallel to the bottom surface of the substrate and, more particularly, the drain-side dielectric liner 298$d$ can be wider than the source-side dielectric liner (e.g., see FIG. 6(10)). Specifically, the source-side dielectric liner 298$s$ can be above a proximal portion of the first source region 215$sl$ such that it is positioned laterally between the second source region 215$su$ and the recess 219. The drain-side dielectric liner 298$d$ can be above the horizontal portion of the L-shaped drain-side gate sidewall spacer 208$d$ and, optionally, can further extend laterally onto a proximal portion of the first drain region 215$dl$ such that it is positioned laterally between the second drain region 215$du$ and the recess 219.

It should be noted that following process 326 of FIG. 3 or 526 of FIG. 5, the source-side and drain-side dielectric liners 198$s$-198$d$, 298$s$-298$d$ will also extend laterally over the top surface of the corresponding source or drain terminal 115$s$-115$d$, 215$s$-215$d$.

Each of the method embodiments can further include selectively removing the third mask layer 117, 217 (see process 328 of FIG. 3; see also process 528 of FIG. 5).

It should be noted that an anneal process (e.g., a high temperature anneal process) can be performed at some point in the process flow between processes 314 and 330 of FIG. 3 or processes 514 and 530 of FIG. 5 in order to improve the ohmic contacts to the channel layer 103, 203.

Following formation of the recess 119, 219 in the dielectric material layer (and thereby formation of the dielectric liners and exposure of the gate material layer 105, 205), different processes can be performed depending upon whether the gate material layer is a first gate metal layer suitable for use in the gate of a HEMT or MISHEMT or a sacrificial gate material layer.

For example, as mentioned above at process 302 of FIG. 3 and process 502 of FIG. 5) in some embodiments (e.g., embodiments used to form the transistor 100A of FIG. 1A or the transistor 200A of FIG. 2A), the gate material layer 105, 205 can be a first gate metal layer. This first gate metal layer can be, for example, a refractive metal or metal alloy layer with a first melting point and first resistance. For example, the first gate metal layer can be a titanium nitride layer, a tantalum nitride layer, or some other suitable refractive metal or metal alloy layer. In these embodiments, the gate material layer 105, 205 can withstand the anneal use to improve the ohmic contacts and, thus, can remain in the gate structure. Thus, processing can simply include forming a second gate metal layer 125, 225 on the first gate metal layer 105, 205 to fill the recess 119, 219, thereby forming the gate 120A, 220A (see process 330 of FIG. 3 and FIG. 1A or process 530 of FIG. 5 and FIG. 2A). The second gate metal layer 125, 225 can have a second melting point, which is lower than the first melting point of the first gate metal layer, and can have a second resistance, which is less than the first resistance of the first gate metal layer. The second gate metal layer 125, 225 can be, for example, aluminum, copper, or some other suitable low resistance metal or metal alloy.

Alternatively, as mentioned above, in other embodiments (e.g., embodiments used to form the transistor 100B of FIG. 1B or the transistor 200B of FIG. 2B), the gate material layer can be a sacrificial gate material layer, which is made, for example, of any suitable material that can be selectively removed from between the gate sidewall spacers without significantly etching away any of the other exposed materials (e.g., of the gate sidewall spacers or dielectric liners). In this case, the gate material layer 105, 205 can be selectively removed (e.g., by a selective isotropic or anisotropic etch process) (e.g., see process 332 of FIG. 3 and FIG. 4(11) or process 532 of FIG. 5 and FIG. 6(11)). Following removal of the gate material layer 105, 205, a conformal first gate material layer 124, 224 can be deposited so as to line the gate opening (which is formed by creation of the recess 119, 219 and removal of the gate material layer 105, 205) and a second gate material layer 125, 225 (e.g., a second gate metal layer) can be deposited so as to fill the remaining space within the gate opening (e.g., see processes 334-336 of FIG. 3 and FIG. 1B or processes 534-536 of FIG. 5 and FIG. 2B)). The conformal first gate metal layer 124, 224 can be a refractive metal or metal alloy layer (e.g., a titanium nitride layer, a tantalum nitride layer, or some other suitable refractive metal or metal alloy layer) or, alternatively, any other suitable metal or metal alloy liner material. The second gate metal layer 125, 225 can be a different metal or metal alloy material with a lower resistance that the metal or metal alloy material used for the conformal first gate metal layer. For example, as with the previously described embodiments, the second gate metal layer 125, 225 can be aluminum, copper or some other suitable low resistance metal or metal alloy. It should be noted that if the desired transistor structure is a MISHEMT and if a gate dielectric layer was not formed within the patterned stack at process 302 of FIG. 3 or process 502 of FIG. 5, then a conformal gate dielectric layer (e.g., a silicon nitride layer or an aluminum oxide layer or some other suitable gate dielectric layer) could be deposited within the gate opening prior to deposition of the conformal first gate metal layer 124, 224.

In any case, following deposition of the second gate metal layer 125, 225, a polishing process (e.g., a chemical mechanical polishing process) can be performed. The CMP can be performed, for example, so as to remove gate metal material from above the dielectric liner material, while leaving the dielectric liner material intact over the source and drain terminals. In this case, the top surface of the gate will be above the level of the top surfaces of the source and drain terminals (as illustrated). Alternatively, the CMP could be performed so as to remove gate metal material from above the dielectric liner material and further so as to remove dielectric liner material from over the source and drain terminals. In this case, the top surface of the gate would be essentially co-planar with the top surfaces of the source and drain terminals.

It should be understood that in the method and structures described above, a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    a gate comprising:
        a first gate section on a barrier layer above a channel layer; and
        a second gate section on the first gate section;
    a source-side gate sidewall spacer positioned laterally adjacent to the first gate section, wherein the second gate section extends over the source-side gate sidewall spacer;
    a source terminal comprising:
        a first source region extending through the barrier layer, wherein the first source region has a proximal portion positioned laterally immediately adjacent to a lower portion of the source-side gate sidewall spacer and further has a distal portion; and
a second source region on the distal portion of the first source region; and
a source-side dielectric liner on the proximal portion of the first source region positioned laterally immediately adjacent to an upper portion of the source-side gate sidewall spacer, wherein the source-side dielectric liner is further positioned laterally between the second gate section and the second source region.

2. The structure of claim 1, wherein the gate comprises a first gate metal layer adjacent to the barrier layer and a second gate metal layer on the first gate metal layer.

3. The structure of claim 2, wherein the first gate section comprises the first gate metal layer and the second gate section comprises the second gate metal layer.

4. The structure of claim 2, wherein the first gate metal layer has a first melting point and first resistance and wherein the second gate metal layer has a second melting point that is lower than the first melting point and a second resistance that is less than the first resistance.

5. The structure of claim 2, wherein the first gate metal layer lines a T-shaped gate opening and wherein the second gate metal layer is on the first gate metal layer and fills the T-shaped gate opening.

6. The structure of claim 1, wherein the gate further comprises a gate dielectric layer between the first gate section and the barrier layer.

7. The structure of claim 1, further comprising;
a drain-side gate sidewall spacer positioned laterally adjacent to the first gate section opposite the source-side gate sidewall spacer, wherein the source-side gate sidewall spacer and the drain-side gate sidewall spacer are essentially symmetric; and
a drain terminal extending through the barrier layer and positioned laterally adjacent to the drain-side gate sidewall spacer.

8. The structure of claim 1, further comprising;
a drain-side gate sidewall spacer positioned laterally adjacent to the first gate section opposite the source-side gate sidewall spacer, wherein the source-side gate sidewall spacer and the drain-side gate sidewall spacer are asymmetric with the drain-side gate sidewall spacer being L-shaped and wider than the source-side gate sidewall spacer; and
a drain terminal extending through the barrier layer and positioned laterally adjacent to the drain-side gate sidewall spacer.

9. A method comprising:
forming a barrier layer on a channel layer; and
forming a structure comprising:
a gate comprising:
a first gate section on the barrier layer; and
a second gate section on the first gate section;
a source-side gate sidewall spacer on the barrier layer and positioned laterally adjacent to the first gate section, wherein the second gate section extends laterally at least partially over the source-side gate sidewall spacer;
a source terminal comprising:
a first source region extending through the barrier layer, wherein the first source region has a proximal portion positioned laterally immediately adjacent to a lower portion of the source-side gate sidewall spacer and further has a distal portion; and
a second source region on the distal portion of the first source region; and
a source-side dielectric liner on the proximal portion of the first source region positioned laterally immediately adjacent to an upper portion of the source-side gate sidewall spacer, wherein the source-side dielectric liner is further positioned laterally between the second gate section and the second source region.

10. The method of claim 9, wherein the forming of the structure comprises:
forming a patterned stack of layer above the barrier layer, wherein the patterned stack comprises a gate material layer and at least one protective layer above the gate material layer;
forming a spacer material layer over the patterned stack;
forming a first mask layer on the spacer material layer, wherein the first mask layer has a first opening exposing an area of the spacer material layer above and wider than the patterned stack;
performing etch processes to form gate sidewall spacers from the spacer material layer and to form a source opening and a drain opening on either side of the patterned stack;
removing the first mask layer;
depositing a source/drain metal layer over the patterned stack and filling the source opening and the drain opening;
forming a second mask layer on the source/drain metal layer, wherein the second mask layer has second opening exposing an area of the source/drain metal layer over and on either side of the patterned stack and wherein the second opening is smaller in width than the first opening;
performing an etch process to form the source terminal and a drain terminal; and
removing the second mask layer.

11. The method of claim 10, wherein the forming of the structure further comprises:
depositing a dielectric material layer;
forming a third mask layer on the dielectric material layer, wherein the third mask layer has a third opening exposing an area of the dielectric material layer over and wider than the patterned stack and wherein the third opening is smaller in width than the second opening; and
performing an etch process to form a recess in the dielectric material layer, wherein formation of the recess results in formation of the source-side dielectric liner and a drain-side dielectric liner at sides of the recess and exposes the gate material layer at a bottom of the recess.

12. The method of claim 11, wherein the gate material layer comprises a first gate metal layer and wherein the forming of the structure further comprises forming a second gate metal layer in the recess in the dielectric material layer immediately adjacent to the first gate metal layer.

13. The method of claim 12, wherein the patterned stack further comprises a gate dielectric layer between the barrier layer and the gate material layer.

14. The method of claim 12, wherein the gate material layer comprises a sacrificial gate material layer and wherein the forming of the structure further comprises:
after the forming of the recess in the dielectric material layer, selectively removing the sacrificial gate material layer to form a gate opening;
lining the gate opening with a conformal first gate metal layer; and forming a second gate metal layer on the first gate metal layer.

15. The method of claim 14, further comprising one of the following:
- before the forming of the patterned stack, forming a gate dielectric layer on the barrier layer such that the patterned stack comprises the gate dielectric layer between the barrier layer and the sacrificial gate material layer; and
- before the lining of the gate opening with the first gate metal layer, lining the gate opening with a conformal gate dielectric layer.

16. A structure comprising:
a gate comprising:
- a first gate section on a barrier layer above a channel layer; and
- a second gate section on the first gate section;
a source-side gate sidewall spacer positioned laterally adjacent to the first gate section, wherein the second gate section extends over the source-side gate sidewall spacer;
a source terminal comprising:
- a first source region extending through the barrier layer, wherein the first source region has a proximal portion adjacent to the source-side gate sidewall spacer and a distal portion; and
- a second source region on the distal portion of the first source region;
- a source-side dielectric liner on the proximal portion of the first source region and positioned laterally between the second gate section and the second source region;
a drain-side gate sidewall spacer positioned laterally adjacent to the first gate section opposite the source-side gate sidewall spacer, wherein the source-side gate sidewall spacer and the drain-side gate sidewall spacer are asymmetric with the drain-side gate sidewall spacer being L-shaped and wider than the source-side gate sidewall spacer; and
a drain terminal extending through the barrier layer and positioned laterally adjacent to the drain-side gate sidewall spacer.

17. The structure of claim 16, wherein the gate comprises a first gate metal layer adjacent to the barrier layer and a second gate metal layer on the first gate metal layer.

18. The structure of claim 17, wherein the first gate section comprises the first gate metal layer and the second gate section comprises the second gate metal layer.

19. The structure of claim 17, wherein the first gate metal layer has a first melting point and first resistance and wherein the second gate metal layer has a second melting point that is lower than the first melting point and a second resistance that is less than the first resistance.

20. The structure of claim 17, wherein the first gate metal layer lines a T-shaped gate opening and wherein the second gate metal layer is on the first gate metal layer and fills the T-shaped gate opening.

* * * * *